US005079507A

United States Patent [19]

Ishida et al.

[11] Patent Number: 5,079,507

[45] Date of Patent: Jan. 7, 1992

[54] AUTOMATIC IMPEDANCE ADJUSTING APPARATUS FOR MICROWAVE LOAD AND AUTOMATIC IMPEDANCE ADJUSTING METHOD THEREFOR

[75] Inventors: Yuji Ishida, Nishinomiya; Michio Taniguchi, Kobe, both of Japan

[73] Assignee: Daihen Corporation, Osaka-fu, Japan

[21] Appl. No.: 471,556

[22] Filed: Jan. 29, 1990

[30] Foreign Application Priority Data

Jan. 30, 1989 [JP] Japan .................................... 1-22038
Sep. 26, 1989 [JP] Japan .................................... 1-251684

[51] Int. Cl.[5] .............................................. G01R 27/04
[52] U.S. Cl. ...................................... 324/645; 324/637
[58] Field of Search ................ 324/645, 646, 642, 637

[56] References Cited

U.S. PATENT DOCUMENTS

| | | | |
|---|---|---|---|
| 2,522,563 | 9/1950 | Blitz | 324/645 |
| 2,692,971 | 10/1954 | Wolf | 324/645 |
| 3,213,363 | 10/1965 | Shively | 324/645 |
| 3,373,357 | 3/1968 | Keenan et al. | 324/645 |
| 3,422,350 | 1/1969 | Goonam | 324/645 |
| 3,470,462 | 9/1969 | Weinschel | 324/645 |
| 3,975,679 | 8/1976 | Weinert et al. | 324/645 |
| 4,866,346 | 9/1989 | Gaudreau et al. | 315/111.21 |
| 4,897,281 | 1/1990 | Arai et al. | 427/8 |

*Primary Examiner*—Kenneth A. Wieder
*Assistant Examiner*—Maura K. Regan
*Attorney, Agent, or Firm*—Scully, Scott Murphy & Presser

[57] ABSTRACT

There are disclosed an automatic microwave impedance adjusting apparatus for a microwave load connected to a microwave oscillator through a microwave transmission line, and an automatic microwave impedance adjusting method therefor. In the apparatus and method, there is measured either an impedance seen looking toward a microwave load at a predetermined reference point of a microwave transmission line connected between a microwave oscillator and the microwave load or a reflection coefficient thereat by detecting a voltage standing wave of a microwave propagating on the microwave transmission line. Thereafter, a controller controls variable impedance means mounted on the microwave load side of the reference point on the microwave transmission line responsive to the value measured at the first step, so as to adjust the impedance seen looking toward the microwave load to a predteremined value.

8 Claims, 15 Drawing Sheets

AUTOMATIC IMPEDANCE ADJUSTING APPARATUS FOR MICROWAVE LOAD AND AUTOMATIC IMPEDANCE ADJUSTING METHOD THEREFOR

BACKGROUND OF THE INVENTION

1. Field of the Invention

The present invention relates to an automatic impedance adjusting apparatus for a microwave load and an automatic impedance adjusting method therefor, more particularly, to an automatic impedance adjusting apparatus for adjusting an impedance seen looking toward a microwave load at a point of a microwave transmission line to a desirable impedance such as an impedance of a microwave oscillator, and an automatic impedance adjusting method 2. Description of Related Art FIG. 1 shows a conventional automatic microwave impedance matching apparatus proposed in the Japanese patent laid open publication No. (JP-A) 63-15502/1988.

Referring to FIG. 1, a rectangular waveguide 100 of the automatic impedance matching apparatus is connected between a microwave oscillator and a microwave load. On the microwave oscillator side in the rectangular waveguide 100, there is arranged a voltage standing wave detector composed of five probes PR11 to PR15 therein aligned at an equal distance of λg/8 in the longitudinal direction thereof, wherein λg is an average waveguide length of the microwave propagating in the rectangular waveguide 100. On the microwave load side in the rectangular waveguide 100, two pairs of composite stubs ST1 and ST2 are arranged at different positions in the longitudinal direction thereof.

The first composite stub ST1 is composed of two stubs S11 and S12 mounted at both ends of a seesaw rod, and the stubs S11 and S12 are driven by a stub driving motor M11 so as to be inserted into and drawn out from the rectangular waveguide 100 reciprocally by a seesaw motion of the seesaw rod. On the other hand, the second composite stubs ST2 is composed of two stubs S13 and S14 mounted at both ends of another seesaw rod, and the stubs S13 and S14 are driven by another stub driving motor M12 in the same manner as the stubs S11 and S12 of the first composite stub ST1.

A voltage standing wave of the microwave propagating in the rectangular waveguide 100 is detected by diodes DI11 to DI15 connected to the probes PR11 to PR15, respectively. After the output of the diode DI11 is outputted to the anode of the diode DI15 so as to compose the output of the diode DI15 therewith, the composed output is inputted to an input terminal of a differential amplifier AMP11 through a resistor R11. Each output of the diodes DI12 and DI14 is inputted to each input terminal of a differential amplifier AMP12, and the output of the diode DI13 is inputted to another input terminal of the differential amplifier AMP11.

The output of the differential amplifier AMP11 is outputted to the stub driving motor M11 through a power amplifier AMP21, and the output of the differential amplifier AMP12 is outputted to the stub driving motor M12 through a power amplifier AMP22.

In the automatic microwave impedance matching apparatus constructed above, output voltages $Va_{11}$ and $Va_{12}$ of respective differential amplifiers AMP11 and AMP12 are expressed by the following equations with voltages $Vp_{11}$ to $Vp_{15}$ of the voltage standing wave detected by respective probes PR11 to PR15.

$$Va_{11} = Vp_{11} - Vp_{14} \quad (1)$$

$$Va_{12} = \tfrac{1}{2}(Vp_{11} + Vp_{15}) - Vp_{13} \quad (2)$$

When the stub driving motors M11 and M12 are driven according to the output voltages $Va_{11}$ and $Va_{12}$, respectively, the voltage standing wave in the rectangular waveguide 100 changes, namely, an impedance seen looking toward the load at the voltage standing wave detector changes. Since the probes PR11 to PR15 are arranged at an equal distance of λg/8 in the longitudinal direction of the rectangular waveguide 100, the output voltages $Va_{11}$ and $Va_{12}$ of respective differential amplifiers AMP11 and AMP12 are orthogonal to each other. Therefore, in the feed back system of the automatic impedance matching apparatus, the composite stubs ST1 and ST2 are driven by the stub driving motor M11 and M12 so that each of the output voltages $Va_{11}$ and $Va_{12}$ becomes zero. When both the output voltages $Va_{11}$ and $Va_{12}$ become zero, the impedance of the microwave oscillator is matched to the load impedance.

However, when the above automatic microwave impedance matching apparatus is applied to an apparatus comprising a plasma generating apparatus such as a plasma etching apparatus, a plasma CVD apparatus or the like, the following problems are caused.

(1) A state of a plasma generated by the plasma generating apparatus may change suddenly, and then, a load impedance thereof may change. In this case, the conventional automatic impedance matching apparatus can not track the change in the load impedance thereof accurately, resulting in a hunting phenomenon therein.

(2) As shown in FIG. 2, there is a hysteresis in a relationship between an output power of the microwave oscillator and a load impedance of the plasma generating apparatus, and particularly, the hysteresis has two discontinuous points 101 and 102. Therefore, the load impedance changes discontinuously at respective discontinuous points 101 and 102, and then, the automatic impedance matching apparatus can not match the load impedance to the impedance of the microwave oscillator.

It is known to those skilled in the art that a plasma may be generated more stably in a state slightly shifted from the impedance matching state. Therefore, it has been desired that the impedance seen looking toward the load is automatically adjusted to a desirable impedance. However, the automatic microwave impedance matching apparatus can not adjust the impedance seen looking toward the load to a desirable impedance.

SUMMARY OF THE INVENTION

An essential object of the present invention is to provide an automatic impedance adjusting apparatus and/or method being capable of more stably and more precisely adjusting an impedance seen looking toward a microwave load to a desirable impedance such as an impedance of an microwave oscillator, even if the load impedance changes.

Another object of the present invention is to provide an automatic impedance adjusting apparatus and/or method being capable of stably supplying a microwave power to a microwave load even though a load impedance thereof changes.

A further object of the present invention is to provide an automatic impedance adjusting apparatus and/or method being suitable for and applicable to a plasma generating apparatus wherein a state of a plasma generated therein changes depending on various kinds of causes.

A still further object of the present invention is provide an automatic impedance adjusting apparatus and/or method being capable for preventing a plasma from generating in a non-equilibrium state.

A still more further object of the present invention is to provide an automatic impedance adjusting apparatus and/or method being capable for transferring a generated plasma from a non-equilibrium state to a quasiequilibrium state.

In order to accomplish the above objects, according to one aspect of the present invention, there is provided an automatic microwave impedance adjusting apparatus comprising:

a microwave transmission line connected between a microwave oscillator and a microwave load;

measuring means for measuring either an impedance seen looking toward the microwave load at a mounted point thereof or a reflection coefficient thereat by detecting a voltage standing wave of a microwave propagating on the microwave transmission line;

variable impedance means for changing an impedance to be connected to a mounted point thereof, the variable impedance means being mounted on the microwave load side of the measuring means on the microwave transmission line; and control means for controlling the variable impedance means responsive to the value measured by the measuring means so as to adjust the impedance seen looking toward the microwave load to a predetermined value.

According to another aspect of the present invention, there is provided an automatic microwave impedance adjusting method including:

a first step of measuring either an impedance seen looking toward a microwave load at a predetermined reference point of a microwave transmission line connected between a microwave oscillator and the microwave load or a reflection coefficient thereat by detecting a voltage standing wave of a microwave propagating on the microwave transmission line; and a second step of controlling variable impedance means mounted on the microwave load side of the reference point on the microwave transmission line responsive to the value measured at the first step, so as to adjust the impedance seen looking toward the microwave load to a predetermined value.

According to a further aspect of the present invention, in the method, the processes of the first and second steps are repeated.

BRIEF DESCRIPTION OF THE DRAWINGS

These and other objects and features of the present invention will become clear from the following description taken in conjunction with the preferred embodiment thereof with reference to the accompanying drawings, in which.

DETAILED DESCRIPTION OF THE PREFERRED EMBODIMENT

Figure 1:
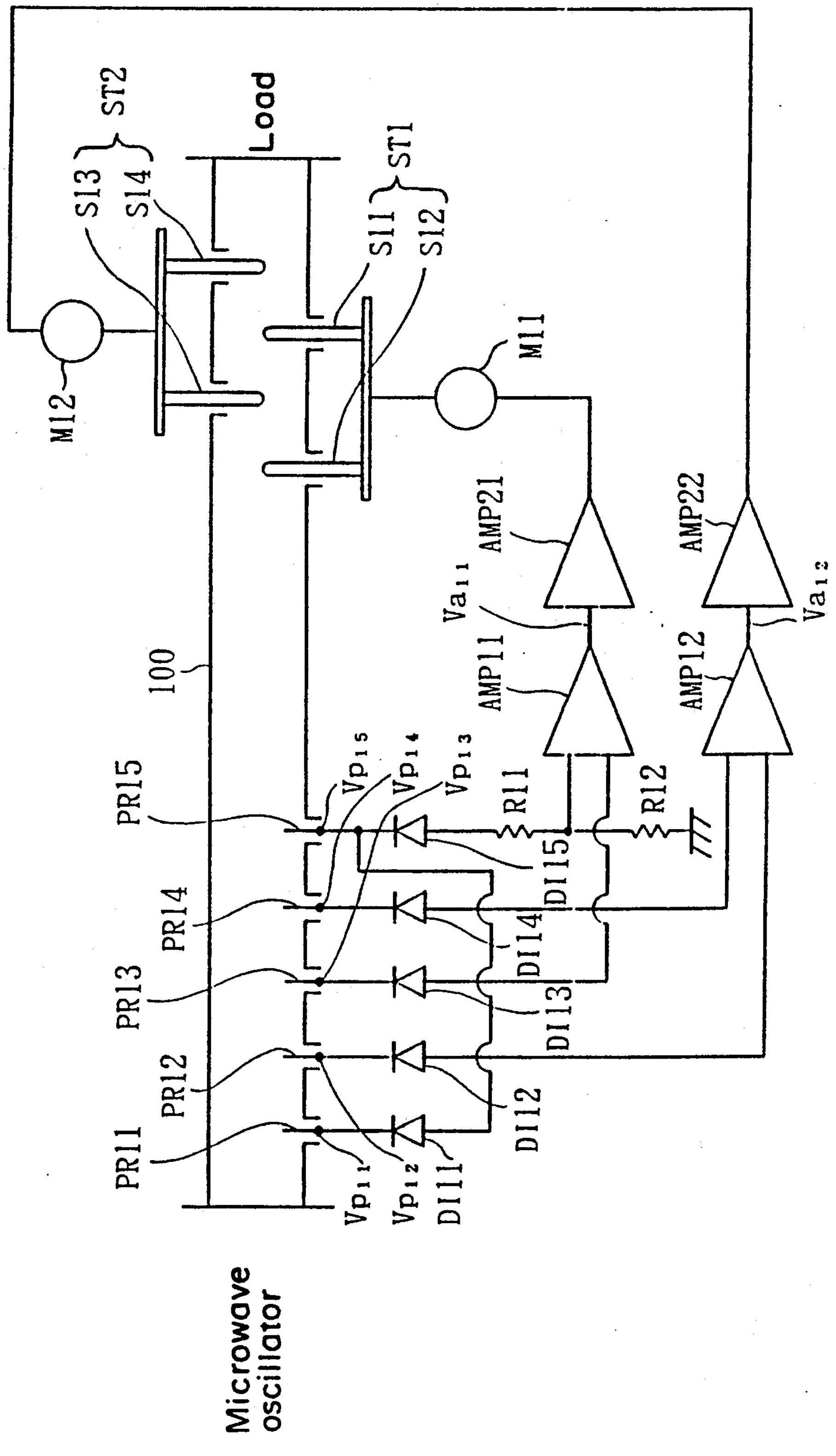
Fig. 1 PRIOR ART
FIG. 1 is a schematic diagram showing a conventional automatic microwave impedance matching apparatus.
Figure 2:
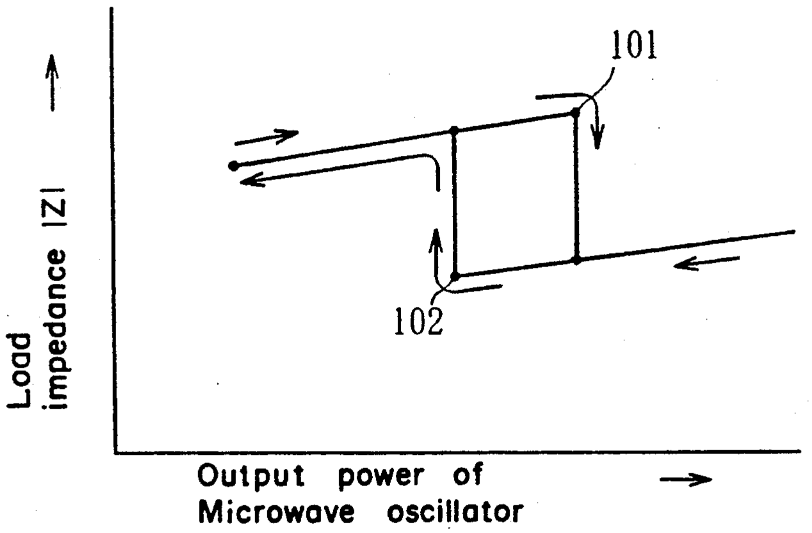
Fig. 2 PRIOR ART
FIG. 2 is a graph showing a relationship between a output power of a microwave oscillator and a load impedance $|Z|$ of a plasma generating apparatus.

An automatic microwave impedance adjusting apparatus of a preferred embodiment according to the present invention will be described below, in the order of the following items, with reference to the attached drawings.

(1) Composition of an automatic impedance adjusting apparatus (2) Composition of a controller and peripheral units thereof (3) Voltage standing wave detector (4) Triple-stub tuner (5) Action of the automatic impedance adjusting apparatus (6) Impedance matching process (7) Modifications It is to be noted that, in this specification, a normalized impedance and a normalized admittance which are given by dividing an impedance and an admittance at a point of a rectangular waveguide 13 by a characteristic impedance of the rectangular waveguide 13 are referred to as an impedance and an admittance hereinafter, respectively.

Figure 3:
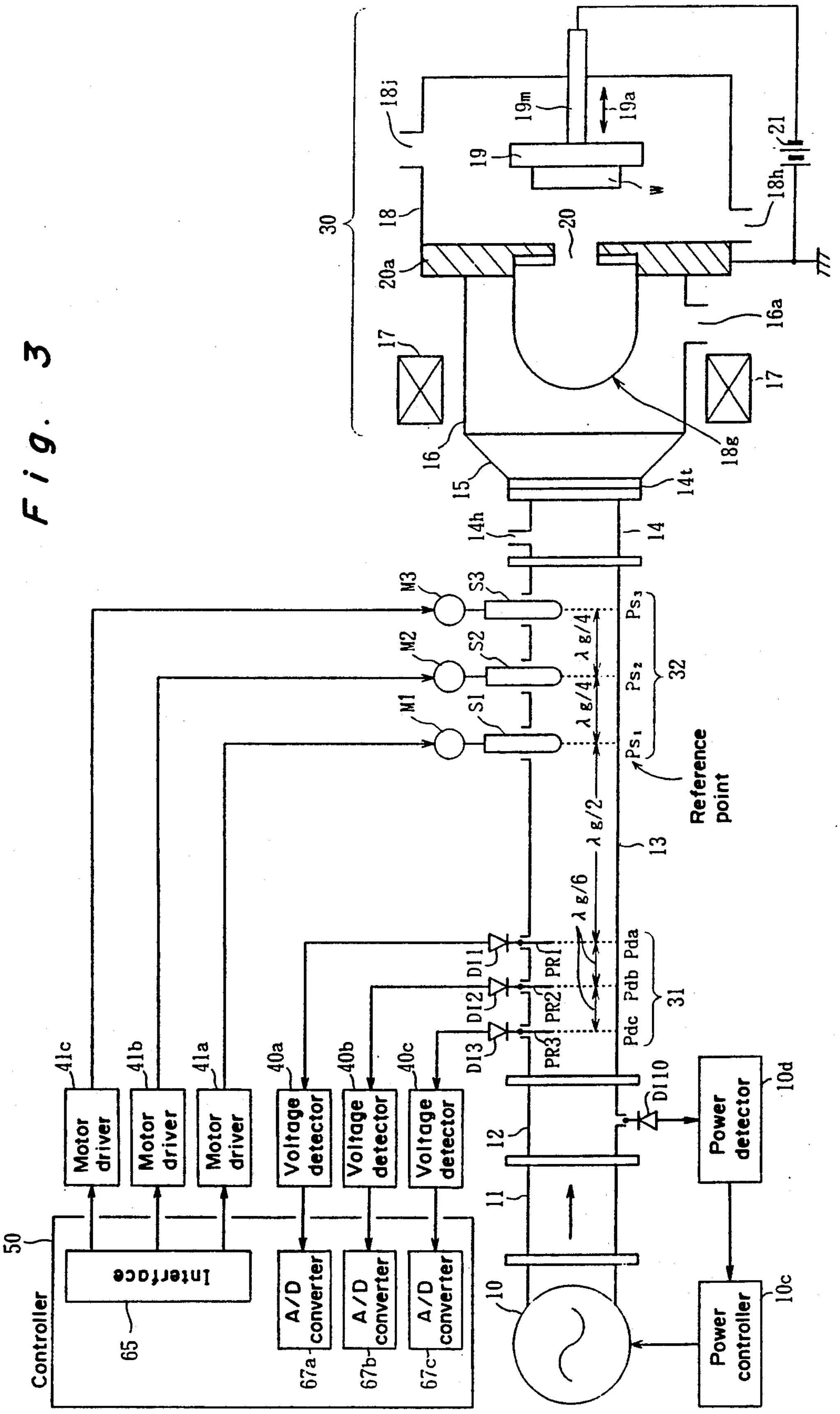
FIG. 3 is a schematic diagram showing an automatic microwave impedance adjusting apparatus of a preferred embodiment according to the present invention.
Figure 4:
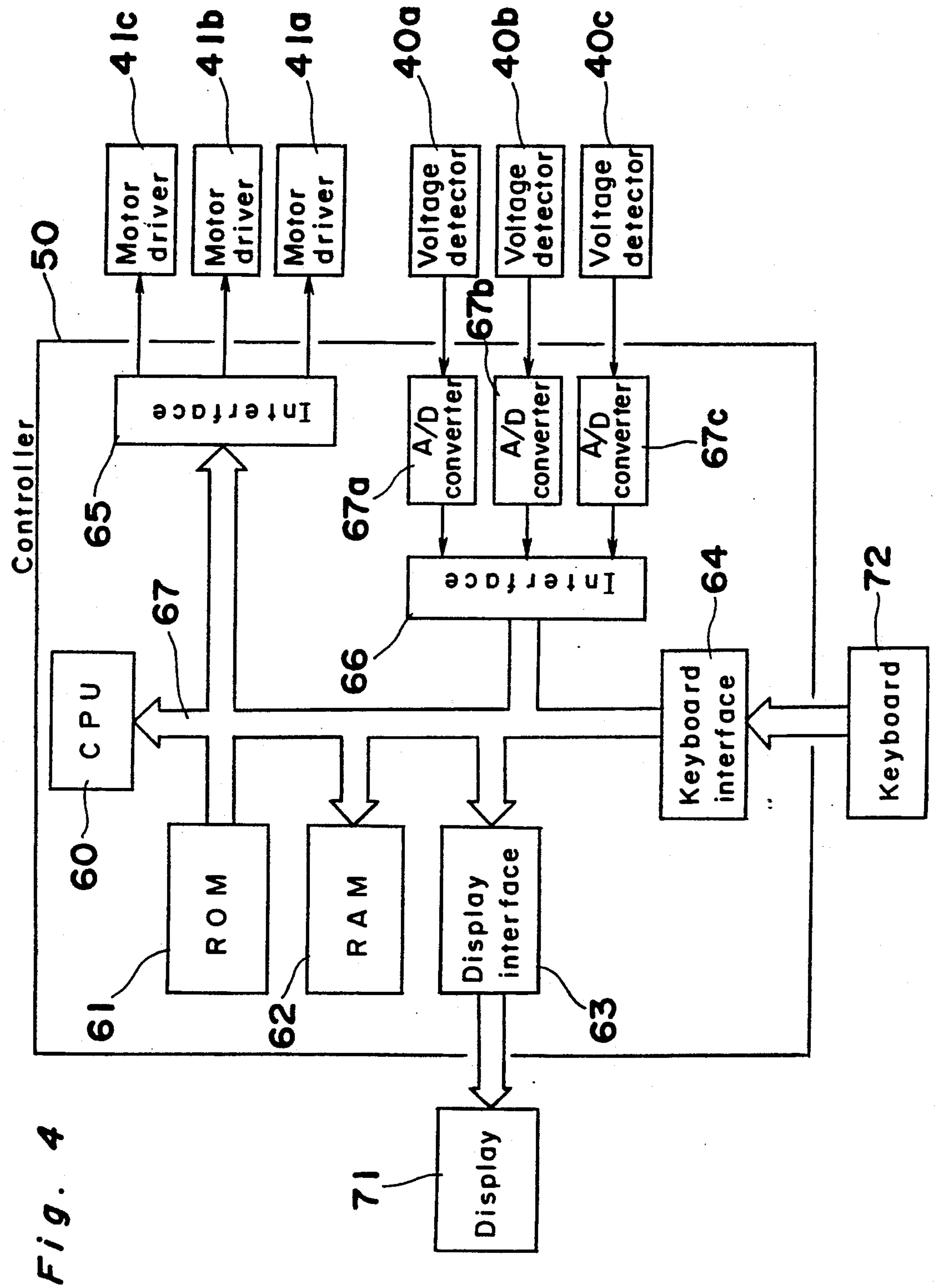
FIG. 4 is a schematic block diagram showing a controller of the automatic microwave impedance adjusting apparatus shown is FIG. 3 and peripheral units thereof.

FIG. 3 shows the automatic microwave impedance adjusting apparatus of the preferred embodiment according to the present invention, and FIG. 4 shows a controller 50 of the automatic microwave impedance adjusting apparatus and peripheral units thereof.

The automatic microwave impedance adjusting apparatus of the present preferred embodiment mainly comprises:

(a) a voltage standing wave detector 31 composed of three probes PR1, PR2 and PR3 for detecting an amplitude of a voltage standing wave of a microwave propagating in the rectangular waveguide 13 which is connected between a microwave oscillator 10 and a plasma generating apparatus 30, the voltage standing wave detector 13 being arranged on the microwave oscillator 10 side in the rectangular waveguide 13;

(b) a triple-stub tuner 32 composed of three stubs S1, S2 and S3 for connecting an admittance in parallel to the transmission line of the rectangular waveguide 13 when driven by stepping motors M1, M2 and M3, the triple-stub tuner 32 being arranged on the plasma generating apparatus 30 side in the rectangular waveguide 13; and (c) the controller 50 for calculating a reflection coefficient Γo at the probe PR1 of the voltage standing wave detector 31 from amplitudes of the voltage standing wave detected by the voltage standing wave detector 31, calculating a desirable admittance Ys corresponding to a desirable reflection coefficient Γs which has been previously inputted using a keyboard 72, calculating insertion lengths of the stubs S1, S2 and S3 required for adjusting an admittance Yo seen looking toward a load of the plasma generating apparatus 30 at a mounted point $Ps_1$ of the stub S1 mounted in the rectangular waveguide 13 (referred to as a reference point hereinafter) to the calculated desirable admittance Ys, and outputting driving signals for driving the stepping motors M1, M2 and M3 so that the stubs S1, S2 and S3 are inserted into the rectangular waveguide 13 by the above calculated insertion lengths, respectively; and the automatic microwave impedance adjusting apparatus is characterized in that an impedance (referred to as a reference impedance hereinafter) Zo seen looking toward the plasma generating apparatus 30 at the reference point $Ps_1$ is automatically adjusted to a desirable impedance Zs corresponding to the inputted desirable reflection coefficient Γs.

The automatic microwave impedance adjusting apparatus has a single operation mode for executing only one impedance adjusting process for adjusting the reference impedance Zo to the desirable impedance Zs corresponding to the inputted desirable reflection coefficient Γs without taking into consideration a change in the load impedance of the plasma generating apparatus 30, and a repeat operation mode for repeating the above impedance adjusting process with taking into consideration the change in the load impedance thereof.

(1) Composition of Automatic impedance adjusting apparatus

Referring to FIG. 3, between the microwave oscillator 10 and the plasma generating apparatus 30, there are connected an isolator 11 for making a microwave outputted from the microwave oscillator 10 propagate toward only the plasma generating apparatus 30, a directional coupler 12, in one port of which there is mounted a diode DI10 for detecting a power of a progressive wave of the microwave propagating therein, the rectangular waveguide 13 wherein there are mounted the voltage standing wave detector 31 and the triple-stub tuner 32, a rectangular waveguide 14 wherein there is formed a hole **14*h* for flowing cooling air thereinto, a taper waveguide 15 for transforming the $TE_{10}$ mode which is the principal mode of the isolator 11 and the rectangular waveguides 13 and 14 into the $TE_{11}$ mode which is the principle mode of a circular waveguide 15, in the order of the isolator 11, the directional coupler 12, the rectangular waveguides 13 and 14 and the taper waveguide 15, in the longitudinal direction thereof. It is to be noted that a connection point of the rectangular waveguide 14 and the taper waveguide 15 is referred to as a load end 14*t* seen looking at the rectangular waveguide 13** of the automatic microwave impedance adjusting apparatus.

The power of the progressive wave of the microwave outputted from the microwave oscillator 10 is detected by the diode DI10 connected to one port of the directional coupler 12, and the detection output is inputted to a power detector **10*d*. The power detector 10*d* outputs a detection signal indicating a power level, which is direct proportional to the square of the detection output, to a power controller 10*c*. The power controller 10*c* controls the microwave oscillator 10** according to the above detection signal so that the microwave power outputted therefrom is kept a predetermined constant power level.

The voltage standing wave detector 31 comprises three probes PR1, PR2 and PR3 which are mounted on the microwave oscillator 10 side in the rectangular waveguide 13. These probes PR1, PR2 and PR3 are mounted in the order of PR1, PR2 and PR3 from the microwave oscillator 10 side at equal spaces of λg/6 in the longitudinal direction of the rectangular waveguide 13 in the center portion of the longitudinal side of the section thereof so as to project thereinto, wherein λg is a waveguide length of the microwave propagating in the rectangular waveguide 13. Mounted points of the probes PR1, PR2 and PR3 in the longitudinal direction of the rectangular waveguide 13 are labeled Pda, Pdb and Pdc hereinafter, respectively.

The voltage standing wave of the microwave propagating in the rectangular waveguide 13 is detected by the diodes DI1, DI2 and DI3 which are respectively connected to the probes PR1, PR2 and PR3, and respective detection outputs thereof are inputted to voltage detectors **40*a*, 40*b* and 40*c*, respectively. The voltage detectors 40*a*, 40*b* and 40*c* detect the voltages of the detection outputs, and output detection signals indicating detected voltage levels to analogue to digital converters (referred to as A/D converters hereinafter) 67*a*, 67*b* and 67*c***, respectively.

The triple-stub tuner 32 comprises three stubs S1, S2 and S3 which are mounted on the plasma generating apparatus 30 side in the rectangular waveguide 13. These stubs S1, S2 and S3 are mounted in the order of S1, S2 and S3 from the microwave oscillator 10 side at equal spaces of λg/4 in the longitudinal direction of the rectangular waveguide 13 in the center portion of the longitudinal side of the section thereof so as to be inserted into and drawn out from the rectangular waveguide 13 in a direction perpendicular to the longitudinal side of the section thereof. It is to be noted that the stub S1 is mounted at a mounted point $Ps_1$ apart by a distance of λg/2 in the longitudinal direction of the rectangular waveguide 13 from the mounted point Pda of the probe PR1 of the voltage standing wave detector 31. Mounted points of respective stubs S1, S2 and S3 are labeled $Ps_1$, $Ps_2$ and $Ps_3$ in the longitudinal direction of the rectangular waveguide 13.

As described later, pulse signals indicating the insertion lengths or the drawing-out lengths of respective stubs S1, S2 and S3 to be inserted into or drawn out from the rectangular waveguide 13, and polarity signals indicating the insertion or the drawing-out operation thereof are outputted from an interface 65 of the controller 50 to respective motor drivers 41*a*, 41*b* and 41*c*. Responsive to these signals, the motor drivers 41*a*, 41*b* and 41*c* amplify the pulse signals, and output the amplified pulse signals having polarities indicated by the above polarity signals to the stepping motors M1, M2 and M3, respectively. The stepping motors M1, M2 and M3 respectively drive the stubs S1, S2 and S3 according to the pulse signals so as to insert them into the rectangular waveguide 13 by insertion lengths corresponding to the pulse numbers of the pulse signals, or draw out them therefrom by drawing-out lengths corresponding to the pulse numbers of the pulse signals.

The plasma generating apparatus 30 is provided for performing an oxidation process for a high temperature superconductor W of oxide group. On the outer peripheral portion of the circular waveguide 16 of the plasma generating apparatus 30, there is mounted an electromagnet 17 for applying a magnetic field onto a glass plasma container 18*g* having a half egg shape which is mounted in the center portion of the circular waveguide 16, in order to not only generate a plasma utilizing an electron cyclotron motion but also store the generated plasma effectively within the plasma container 18*g*. Furthermore, in the outer peripheral portion of the circular waveguide 16, there is formed a cooling air outlet 16*a* for exhausting the cooling air which has been flowed from the hole 14*h* of the rectangular waveguide 14 into the outside of the circular waveguide 16. It is to be noted that the cooling air is flowed thereinto in order to prevent the temperature of the plasma container 18*g* from increasing when the plasma container 18*g* receives an energy from the plasma generated therein, so as to prevent the plasma container 18*g* from being broken due to the over heating.

In the center portion positioned between the plasma container 18*g* mounted in the circular waveguide 16 and a plasma processing chamber 18 for processing a superconductor W to be processed, there is formed a plasma outlet 20 for flowing out the plasma generated in the plasma container 18*g* into the plasma chamber 18. On the outer peripheral portion of the plasma outlet 20, there is mounted a ring-shaped electrode 20*a* which is electrically connected to a positive electrode of a direct-current voltage source 21 and ground. Furthermore, a negative electrode of the direct-current voltage source 21 is electrically connected to a support mechanism 19*m*.

In the center portion of the plasma processing chamber 18, there is arranged a table 19 for mounting the superconductor W to be processed. The table 19 is connected to the support mechanism 19*m* for moving the table 19 in directions as indicated by arrows 19*a*. Further, in the positions opposing to each other of the outer peripheral portion of the plasma processing chamber 18, there are formed an oxygen gas inlet 18*h* for supplying oxygen gas into the plasma processing chamber 18, and an oxygen gas outlet 18*j* for exhausting the supplied oxygen gas into the outside of the plasma processing chamber 18.

In the plasma generating apparatus constructed above, after the table 19 on which the superconductor W to be processed is brought close to the plasma outlet 20 by the support mechanism 10*m*, the inside of the plasma processing chamber 18 is kept at an oxygen gas pressure in the range from $10^{-4}$ Torr to $10^{-2}$ Torr, and then, the superconductor W to be processed is heated at a temperature in the range from 200 ° C. to 400 ° C. Thereafter, a microwave having a frequency such as 2.45 GHz is generated by the microwave oscillator 10. The generated microwave propagates in the isolator 11, the directional coupler 12, the rectangular waveguides 13 and 14, the taper waveguide 15, and the circular waveguide 16, and is incident to the plasma processing chamber 18. On the other hand, a magnetic field is applied to the microwave incident into the circular waveguide 16 in a direction perpendicular to the propagation direction of the microwave by the electromagnet 17, so as to generate an electron cyclotron resonance for the incident microwave at the position on the left side in FIG. 3 of the superconductor W to be processed which is arranged in the plasma processing chamber 18. Furthermore, a negative voltage such as a voltage in the range from −5 V to −100 V is applied to the ring-shaped electrode 20*a* mounted on the outer peripheral portion of the plasma outlet 20 relative to a potential of the table 19 on which the superconductor W to be processed is mounted. After a time in the range from 30 minutes to one hour has passed in this state, a film of the superconductor W is oxidized, and then, a superconductor having a high temperature superconductor characteristics can be obtained.

(2) Composition of Controller and Peripheral units thereof

FIG. 4 shows the controller 50 for controlling the operation of the automatic microwave impedance adjusting apparatus and the peripheral units thereof.

Referring to FIG. 4, the controller 50 comprises a central processing unit (referred to as a CPU hereinafter) 60 for controlling the impedance adjusting process of the automatic microwave impedance adjusting apparatus, a read only memory (referred to as a ROM hereinafter) 61 for storing a system program for executing the process of the CPU 60 and data required for executing the above system program, and a random access memory (referred to as a RAM hereinafter) 62 for being used as a working area and storing data required in the processing of the CPU 60.

The controller 50 further comprises a display interface 63 connected to a display 71, a keyboard interface 64 connected to the keyboard 72, the A/D converters 67*a*, 67*b* and 67*c*, an interface 66 connected to the A/D converters 67*a*, 67*b* and 67*c*, and an interface 65 connected to the motor drivers 41*a*, 41*b* and 41*c*. In the controller 50, the CPU 60, the ROM 61, the RAM 62, the display interface 63, the keyboard interface 64 and the interfaces 65 and 66 are connected to each other through a bus 67.

Respective detection signals outputted from the voltage detectors 40*a*, 40*b* and 40*c* are A/D converted to digital data, and then, the digital data are transferred to the RAM through the interface 66 and the bus 67, and are stored therein. The CPU 60 calculates data of the insertion lengths or the drawing-out lengths of respective stubs S1, S2 and S3 required for adjusting the reference impedance Zo seen looking toward the load at the reference point $Ps_1$ to the above desirable impedance Zs from the digital data of detection signals, and a desirable reflection coefficient Γs which has been previously inputted using the keyboard 72, and outputs the calculated data and data indicating the insertion or the drawing-out operation of respective stubs S1, S2 and S3, to the interface 65 through the bus 67.

Responsive to the data, the interface 65 generates the pulse signals indicating the insertion lengths or the drawing-out lengths of respective stubs S1, S2 and S3 to be inserted into or drawn out from the rectangular waveguide 13, and the polarity signals indicating the insertion or the drawing-out operation thereof, to respective motor drivers 41*a*, 41*b* and 41*c*. It is to be noted that the impedance adjusting process executed by the CPU 60 will be described in detail later, with reference to flowcharts shown in FIGS. 22 to 24.

The display 71 displays impedance points seen looking toward the load on a Smith chart, and the insertion lengths of respective stubs S1, S2 and S3, according to the data inputted from the CPU 60 through the display interface 63.

The keyboard 72 comprises a operation mode selection key (not shown) for selecting either the repeat operation mode or the single operation mode, and a set of ten keys (not shown) for inputting the absolute value |Γs| and the phase θs of the reflection coefficient Γs corresponding to the desirable impedance Zs, and outputs the inputted data to the CPU 60 through the keyboard interface 64.

(3) Voltage standing wave detector

The voltage standing wave detector 31 comprises three probes PR1, PR2 and PR3 mounted at respective points Pda, Pdb and Pdc in the longitudinal direction of the rectangular waveguide 13 at equal spaces of λg/6, as described above.

Figure 5:
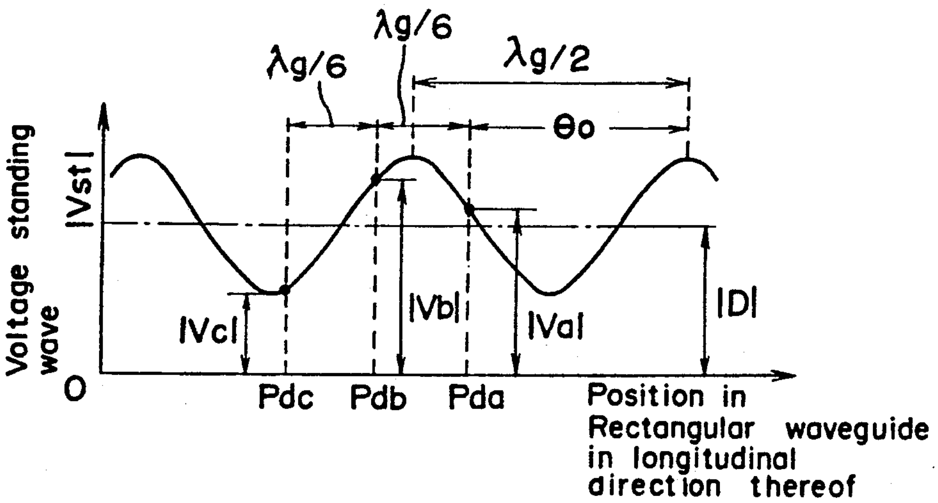
FIG. 5 is a chart showing a voltage standing wave pattern in a rectangular waveguide shown in FIG. 3.

FIG. 5 shows a voltage standing wave pattern |Vst| when there is a reflected wave propagating from the load end 14*t* in the rectangular waveguides 13 and 14, namely, the load impedance $Ps_1$ seen looking toward the load at the reference point is mismatched to the impedance seen looking toward the microwave oscillator 10.

Referring to FIG. 5, the amplitude |Vst| of the voltage standing wave changes periodically with a period of λg/2. In FIG. 5, the amplitudes of the voltage standing wave at the points Pda, Pdb and Pdc are labeled |Va|, |Vb| and |Vc|, respectively.

Figure 6:
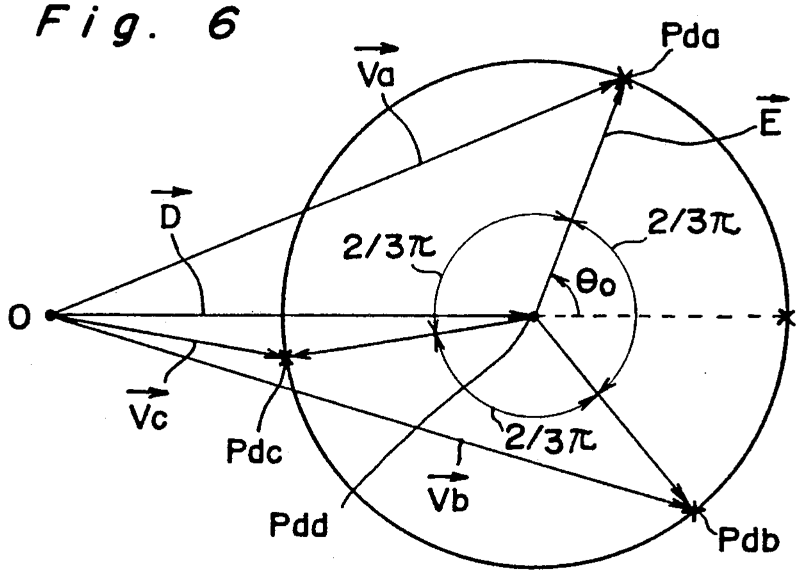
FIG. 6 is a crank diagram showing respective vectors of the voltage standing wave at mounted points of respective probes shown in FIG. 3.

FIG. 6 is a crank diagram showing a relationship among vectors Va, Vb and Vc of the amplitudes Va, Vb and Vc of the voltage standing wave, a vector D of a progressive wave voltage D, and a vector E of a reflected wave voltage E. In FIG. 6, θo is a phase of the reflected wave voltage E relative to a point where the amplitude |Vst| of the voltage standing wave becomes a maximum. Then, the reflection coefficient Γo at the mounted point Pda of the probe PR1 is expressed as follows:

$$\Gamma o = |\Gamma o| \cdot e^{j\theta o} \quad (3)$$

Since the mounted point Pda of the probe PR1 is apart by a distance of λg/2 in the longitudinal direction of the rectangular waveguide 13 from the reference point $Ps_1$ at which the stub S1 is mounted, the reflection coefficient Γo expressed by the above equation (3) is a reflection coefficient at the reference point $Ps_1$.

As shown in FIG. 6, respective vectors $\vec{V}a$, $\vec{V}b$ and $\vec{V}c$ of the amplitudes of the voltage standing wave are a sum of the vector $\vec{D}$ of the progressive wave voltage D and the vector $\vec{E}$ of the reflected voltage E. Respective end points of the vector $\vec{V}a$, $\vec{V}b$ and $\vec{V}c$ are positioned on a circle having a radius equal to the amplitude of the vector $\vec{E}$ of the reflected wave voltage E and a center point which is located at the end point Pdd of the vector $\vec{D}$ of the progressive wave voltage D so that each difference between respective phases thereof becomes ⅔π. When the amplitude |Vst| of the voltage standing wave becomes a maximum, the phase θo becomes zero, and the reflection coefficient Γo becomes |Γo|. On the other hand, the amplitude |Vst| of the voltage standing wave becomes a minimum, the phase θo becomes π, and the reflection coefficient Γo becomes −|Γo|.

Furthermore, as is apparent from FIG. 6, the squares of respective amplitudes of the voltage standing wave $|Va|^2$, $|Vb|^2$ and $|Vc|^2$ detected by the probes PR1, PR2 and PR3 are expressed as follows:

$$|Va|^2 = |E|^2 + |D|^2 - 2|E| \cdot |D| \cdot \cos(\pi - \theta o) \quad (4)$$

$$|Va|^2 = |E|^2 + |D|^2 - 2|E| \cdot |D| \cdot \cos(\pi - \theta o) \quad (4)$$

$$|Vb|^2 = |E|^2 + |D|^2 - 2|E| \cdot |D| \cdot \cos\left(\pi - \theta o + \frac{4}{3}\pi\right) \quad (5)$$

$$|Vc|^2 = |E|^2 + |D|^2 - 2|E| \cdot |D| \cdot \cos\left(\pi - \theta o + \frac{2}{3}\pi\right) \quad (6)$$

$$|Vc|^2 = |E|^2 + |D|^2 \cdot 2|E| \cdot |D| \cdot \cos(\pi - \theta o + \tfrac{2}{3}\pi) \quad (5)$$

Furthermore, the absolute value |Γo| of the reflection coefficient Γo is expressed as follows:

$$|\Gamma o| = \frac{|E|}{|D|} \quad (7)$$

Therefore, since respective amplitudes |Va|, |Vb| and |Vc| of the voltage standing wave can be measured by the voltage standing wave detector 31, the absolute value |Γo| and the phase Γo of the reflection coefficient Γo can be obtained by calculating the solutions of the simultaneous equations (4) to (7). Furthermore, the admittance or the impedance seen looking toward the plasma generating apparatus 30 at the reference point $Ps_1$ can be calculated using equations (9) to (11) which are described later, from the absolute value |Γo| and the phase θo.

(4) Triple-stub tuner

The triple-stub tuner 32 comprises three stubs S1, S2 and S3 mounted at respective points $Ps_1$, $Ps_2$ and $Ps_3$ of the rectangular waveguide 13 at equal spaces of λg/4 in the longitudinal direction thereof, as described above.

Figure 21:
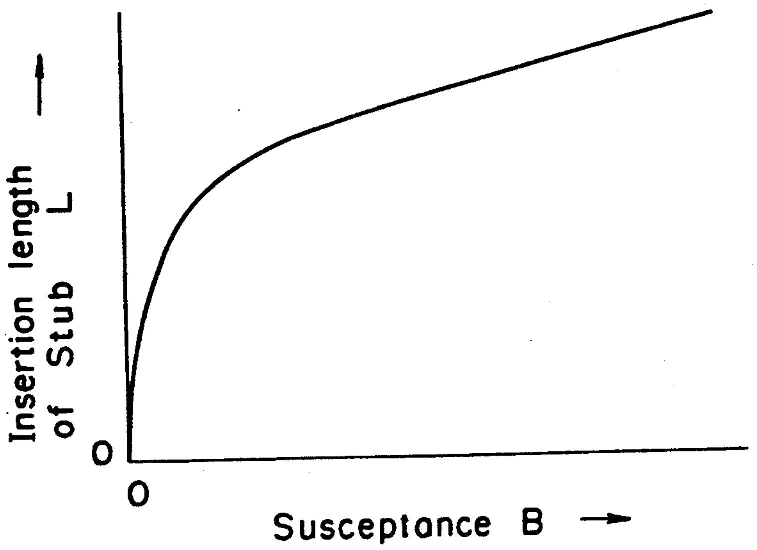
FIG. 21 is a graph showing a relationship between an insertion length of each stub of the triple-stub tuner shown in FIG. 1 when inserted into the rectangular waveguide, and a susceptance connected to the stub point.

FIG. 21 shows a relationship between an insertion length L of each of the stubs S1, S2 and S3 when inserted into the rectangular waveguide 13, and a susceptance B connected to the mounted point of each stub in the rectangular waveguide 13.

As is apparent from FIG. 21, as the insertion length L of each of the stubs S1, S2 and S3 increases, the susceptance B of the mounted point increases. Namely, each of the stubs S1, S2 and S3 operates as an admittance element having a pure susceptance B.

Figure 7:
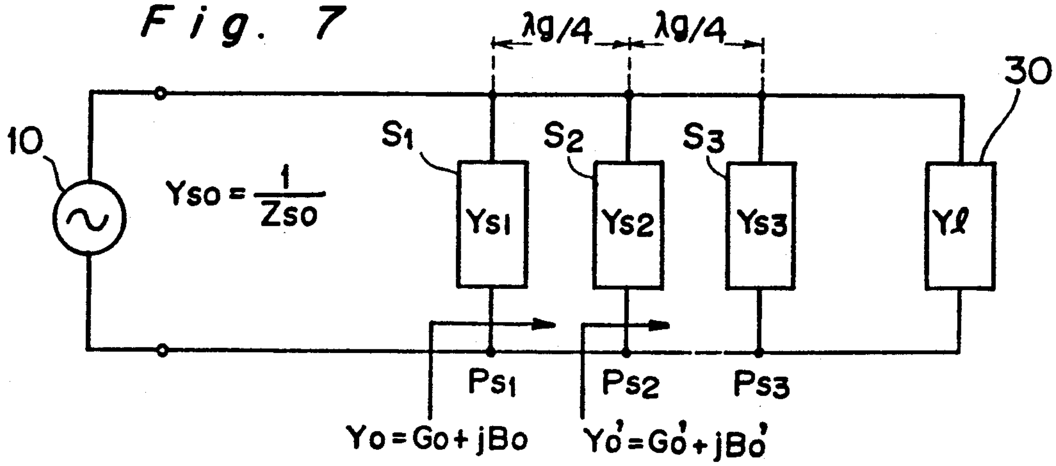
FIG. 7 is a circuit diagram showing an equivalent circuit of a triple-stub tuner arranged between the microwave oscillator and the plasma generating apparatus shown in FIG. 3.

FIG. 7 shows an equivalent circuit of the triple-stub tuner 32 which is connected between the microwave oscillator 10 and the plasma generating apparatus 30.

Referring to FIG. 7, the microwave oscillator 10, respective admittance elements $Ys_1$, $Ys_2$ and $Ys_3$ of the stubs S1, S2 and S3, and a load admittance Yl of the plasma generating apparatus are connected in parallel. Therefore, the triple-stub tuner 32 can adjust the admittance Yo=Go+jBo seen looking toward the load of the plasma generating apparatus 30 at the reference point $Ps_1$ where the stub S1 is mounted, to a desirable admittance Ys=1/Zs.

For example, in order to match the load admittance Yo seen looking toward the plasma generating apparatus 30 to the admittance of the microwave oscillator 10, it is apparent that the stubs S1, S2 and S3 are respectively inserted into the rectangular waveguide 13 by such insertion lengths that the admittance Yo seen looking toward the plasma generating apparatus 30 at the reference point $Ps_1$ is matched to the admittance Yso=1/Zso seen looking toward the microwave oscillator 10 at the reference point $Ps_1$.

In the automatic microwave impedance adjusting apparatus of the present preferred embodiment, there is calculated the insertion lengths of respective stubs S1, S2 and S3 required for adjusting the admittance Yo seen looking toward the load of the plasma generating apparatus 30 at the reference point $Ps_1$ to a desirable admittance Ys including the admittance Yso seen looking toward the microwave oscillator 10 at the reference point $Ps_1$, by the CPU 60 of the controller 50, and then, the stepping motors M1, M2 and M3 are driven so that the stubs S1, S2 and S3 are inserted into the rectangular waveguide 13 by the calculated insertion lengths, respectively.

Figure 8:
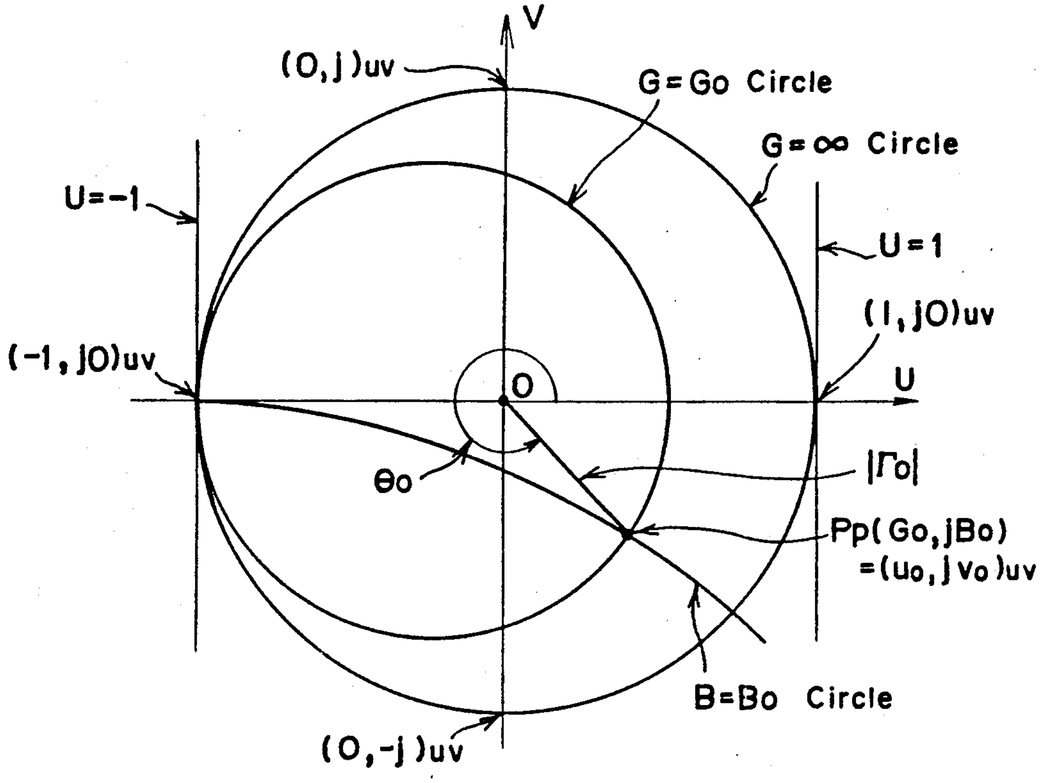
FIGS. 8 and 9 are reflection coefficient charts and Smith charts showing an admittance contour thereon when stubs S1, S2 and S3 of the triple-stub tuner shown in FIG. 3 are inserted into and drawn out from the rectangular waveguide.

FIG. 8 shows a relationship between a Smith chart and a UV orthogonal coordinates (referred to as a UV coordinates hereinafter) of a complex plane of a reflection coefficient Γ.

As shown in FIG. 8, the reflection coefficient Γo at the reference point $Ps_1$ is expressed as follows:

$$\Gamma o = |\Gamma o| \cdot e^{j\theta o} = u_o + jv_o \tag{8}$$

where $u_o$ and $v_o$ are a coordinate value of the U-axis and a coordinate value of the V-axis of the UV coordinates.

Furthermore, the admittance Yo=1/Zo seen looking toward the load of the plasma generating apparatus 30 at the reference point $Ps_1$ is uniquely expressed as follows:

$$\begin{aligned} Yo &= Go + jBo \\ &= \frac{1 - |\Gamma o| \cdot e^{j\theta o}}{1 + |\Gamma o| \cdot e^{j\theta o}} \\ &= \frac{1 - u_o - jv_o}{1 + u_o + jv_o} \end{aligned} \tag{9}$$

An admittance point Pp of the admittance Yo is shown on the Smith chart and the UV coordinates of FIG. 8. Furthermore, the conductance Go and the susceptance bo of the admittance Yo are uniquely expressed as follows:

$$Go = \frac{1 - u_o^2 - v_o^2}{(1 + u_o)^2 + v_o^2} \tag{10}$$

$$Bo = \frac{-2v_o}{(1 + u_o)^2 + v_o^2} \tag{11}$$

Furthermore, transforming the above equations (8) and (9) gives:

$$\left(u_o + \frac{Go}{Go + 1}\right)^2 + V_o^2 = \left(\frac{1}{Go + 1}\right)^2 \tag{12}$$

$$(u_o + 1)^2 + \left(v_o + \frac{1}{Bo}\right)^2 = \left(\frac{1}{Bo}\right)^2 \tag{13}$$

The above equation (12) represents a G=Go circle which includes the admittance point Pp on the Smith chart and is tangent to a U=−1 straight line, as shown in FIG. 8. Also, the above equation (13) represents a B=Bo circle which includes the admittance point Pp on the Smith chart and a point of the UV coordinates (−1, j0)uv, as shown in FIG. 8.

It is to be noted that, in the specification and FIGS. 8 to 20, UV coordinates of an admittance point located on the Smith chart are represented hereinafter by a coordinate representation with a suffix "uv" such as (0,j)uv, (1, j0)uv, and also, coordinates of an admittance point located on the Smith chart which indicate a conductance and a susceptance thereof s represented hereinafter by a coordinate representation without any suffix such as (Go, jBo).

When the insertion length of the stub S1 located at the reference point $Ps_1$ or the stub S3 located at the point $Ps_3$ apart from the reference point $Ps_1$ by a distance of λg/2 in the longitudinal direction of the rectangular waveguide 13 is changed, only the susceptance B to be connected to the point $Ps_1$ at $Ps_3$ of the rectangular waveguide 13 changes, as described above. Therefore, when the insertion length of the stub S1 or S3 of the triple-stub tuner 32 is changed, the admittance point Pp of the admittance Yo seen looking toward the load of the plasma generating apparatus 30 at the points $Ps_1$ and $Ps_3$ moves on the G=Go circle on the Smith chart shown in FIG. 8.

Furthermore, an admittance point of an admittance Yo' seen looking toward the load of the plasma generating apparatus 30 at the point $Ps_2$ of the stub S2 is located at a point Pp' given when the admittance point Pp of the admittance Yo on the Smith chart is rotated around the original O of the UV coordinates by 180 degrees, and the admittance Yo' is uniquely expressed as follows:

$$\begin{aligned} Yo' &= Go' + jBo' \\ &= \frac{1 + |\Gamma o| \cdot e^{j\theta o}}{1 - |\Gamma o| \cdot e^{j\theta o}} \\ &= \frac{1 + u_o + jv_o}{1 - u_o - jv_o} \end{aligned} \tag{14}$$

It is to be noted that respective references of an admittance, a conductance and a susceptance seen looking toward the load of the plasma generating apparatus 30 are suffixed with a dash mark ' so as to distinguish them from those seen looking toward the load at the reference point $Ps_1$.

Further, the conductance Go' and the susceptance Bo' of the admittance Yo' are uniquely expressed as follows:

$$Go' = \frac{1 - u_o^2 - v_o^2}{(1 - u_o)^2 + v_o^2} \tag{15}$$

-continued $$Bo' = \frac{2v_o}{(1-u_o)^2 + v_o^2} \quad (16)$$

Furthermore, transforming the above equations (15) and (16) gives:

$$\left(u_o - \frac{G_o'}{Go'+1}\right)^2 + v_o^2 = \left(\frac{1}{Go'+1}\right)^2 \quad (17)$$

$$(u_o - 1)^2 + \left(v_o - \frac{1}{Bo'}\right)^2 = \left(\frac{1}{Bo'}\right)^2 \quad (18)$$

Figure 9:
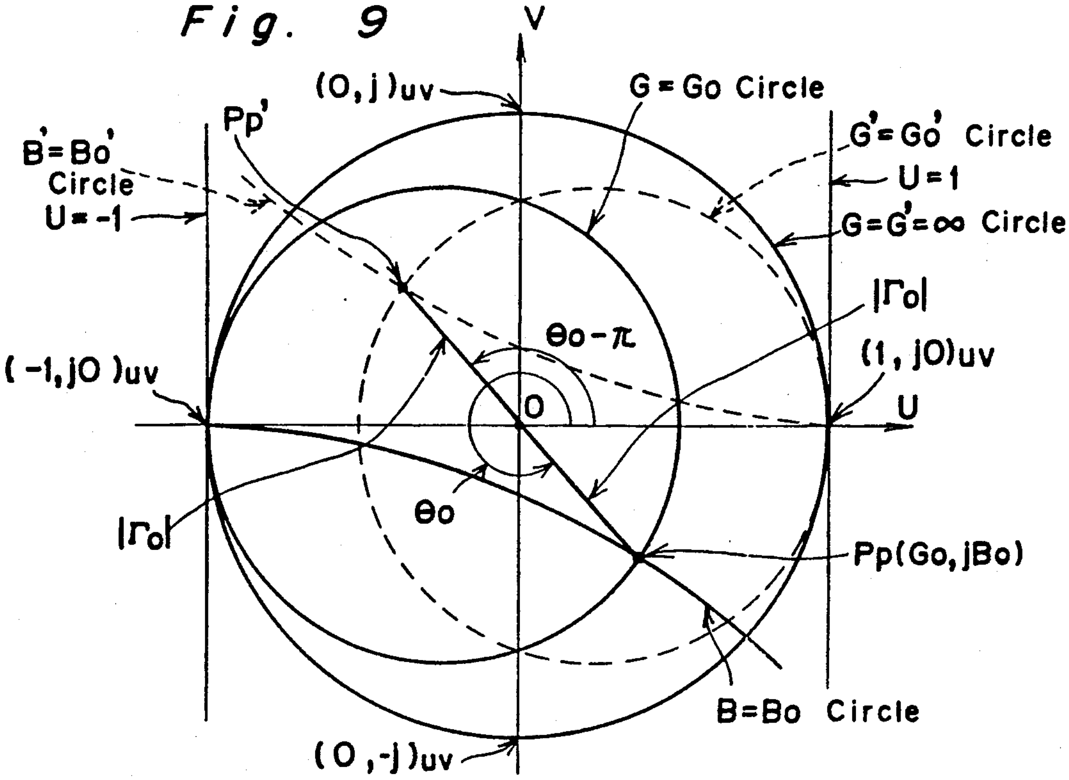

The above equation (17) represents a G'32 Go' circle which includes the admittance point Pp' on the Smith chart and is tangent to a U=1 straight line, as shown in FIG. 9, and the G'=Go' circle and the G=Go circle are point symmetric with respective to the origin O of the UV coordinates. Also, the above equation (18) represents a B' =Bo' circle which includes the admittance point Pp' on the Smith chart and a point of the UV coordinates (1, j0)uv, as shown in FIG. 8, and the B'=Bo' circle and the B=Bo circle are point symmetric with respective to the origin O of the UV coordinates.

It is to be noted that, in FIGS. 9 to 20, the coordinates of the Smith chart are represented by coordinates of an admittance point of an admittance seen looking toward the load at the reference point $Ps_1$. Furthermore, in all FIGS. 9 to 20, a G=G'=∞ circle which includes points of the UV coordinates (1, j0)uv, (0, j)uv, (−1, j0)uv and (0, −j)uv is drawn as a maximum reference circle.

When the insertion length of the stub S2 located at the point $Ps_2$ of the rectangular waveguide 13 is changed, only the susceptance B to be connected to the point $Ps_2$ of the rectangular waveguide 13 changes, as described above. Therefore, when the insertion length of the stub S2 of the triple-stub tuner 32 is changed, the admittance point Pp' of the admittance Yo' seen looking toward the load of the plasma generating apparatus 30 at the points $Ps_2$ moves on the G'−Go' circle on the Smith chart shown in FIG. 9.

In the impedance adjusting process executed by the CPU 60 of the controller 50 as described later, the susceptance Bo' of the admittance Yo' seen looking toward the load at the point $Ps_2$ of the stub S2 is calculated from the UV coordinates of the admittance point Po of the admittance Yo seen looking toward the load at the reference point $Ps_1$, and also, the susceptance Bo of the admittance Yo seen looking toward the load at the reference point $Ps_1$ is calculated from the UV coordinates of the admittance point Pp' of the admittance Yo' seen looking toward the load at the point $Ps_2$ of the stub S2. In these calculations, the converted susceptance can be calculated by inverting respective signs of the coordinate values of the U-axis and V-axis and substituting the inverted UV coordinates into the equation (11).

(5) Action of Automatic impedance adjusting apparatus

Figure 22:
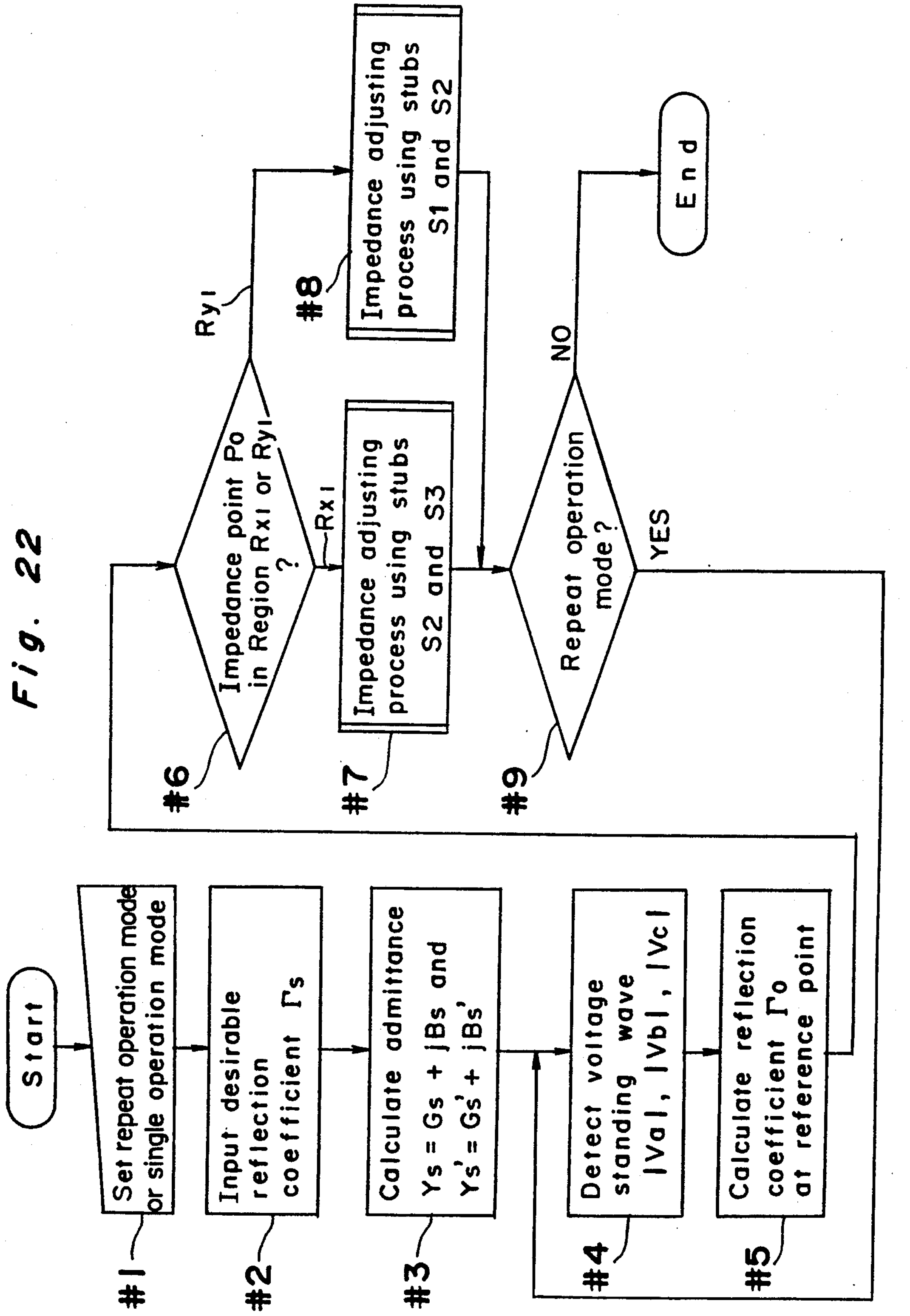
FIG. 22 is a flowchart showing a main routine of an automatic impedance adjusting process executed by a CPU of the controller shown in FIG. 4.

FIG. 22 is flowchart showing a main routine of an impedance adjusting process executed by the CPU 60 of the controller 50. The main routine includes two subroutines executed at steps #7 and #8 of FIG. 22.

(5-1) Main routine of Impedance adjusting process

Referring to FIG. 22, first of all, at step #1, either the repeat operation mode or the single operation mode is selected using the operation mode selection key of the keyboard 72, and then, at step #2, an absolute value |Γs| and a phase θs of a desirable reflection coefficient Γs corresponding to a desirable impedance Zs seen looking toward the load at the reference point $Ps_1$ are inputted using a set of ten keys of the keyboard 72.

Figure 10:
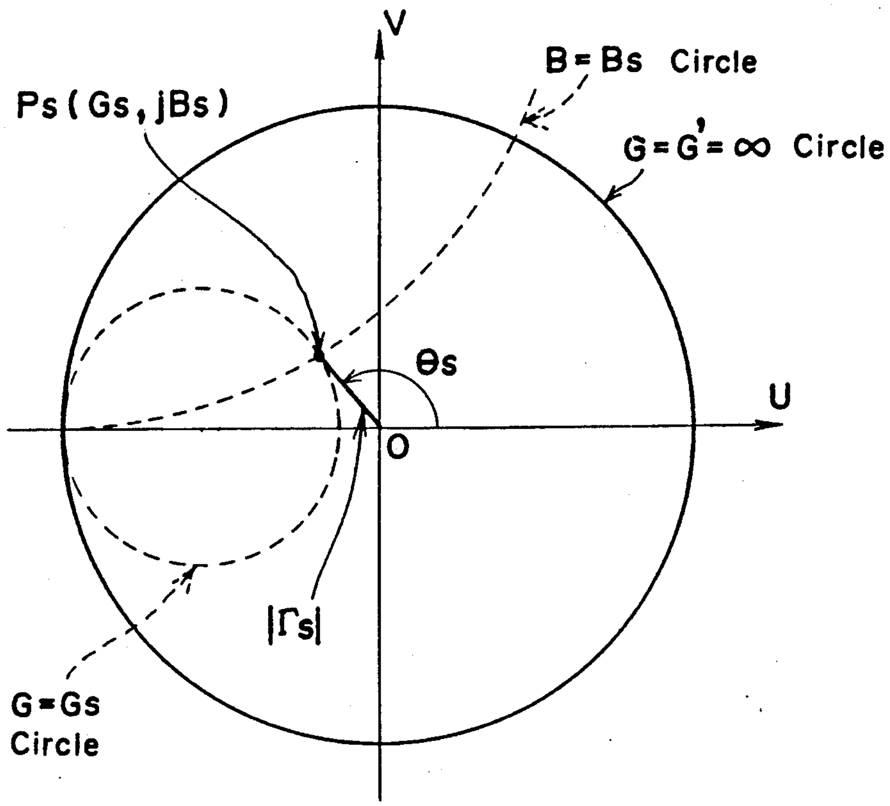
FIGS. 10 to 20 are reflection coefficient charts and Smith charts showing an action of the automatic microwave impedance adjusting apparatus shown in FIGS. 1 and 2.

Thereafter, at step #3, the CPU 60 calculates a conductance Gs and a susceptance Bs of a desirable admittance Ys corresponding to the inputted reflection coefficient Γs, using the equations (9) to (11) from the absolute value |Γs| and the phase θo which have been inputted, wherein the admittance point of the desirable admittance Ys is located at an intersection Ps of the G=Gs circle and the B=Bs circle on the Smith chart, as shown in FIG. 10. Thereafter, there are calculated a conductance Gs' and a susceptance Bs' of an admittance Ys' seen looking toward the load at the point $Ps_2$ of the stub S2 which is given when the phase of the admittance Ys is inverted, using the equations (15) and (16).

Figure 11:
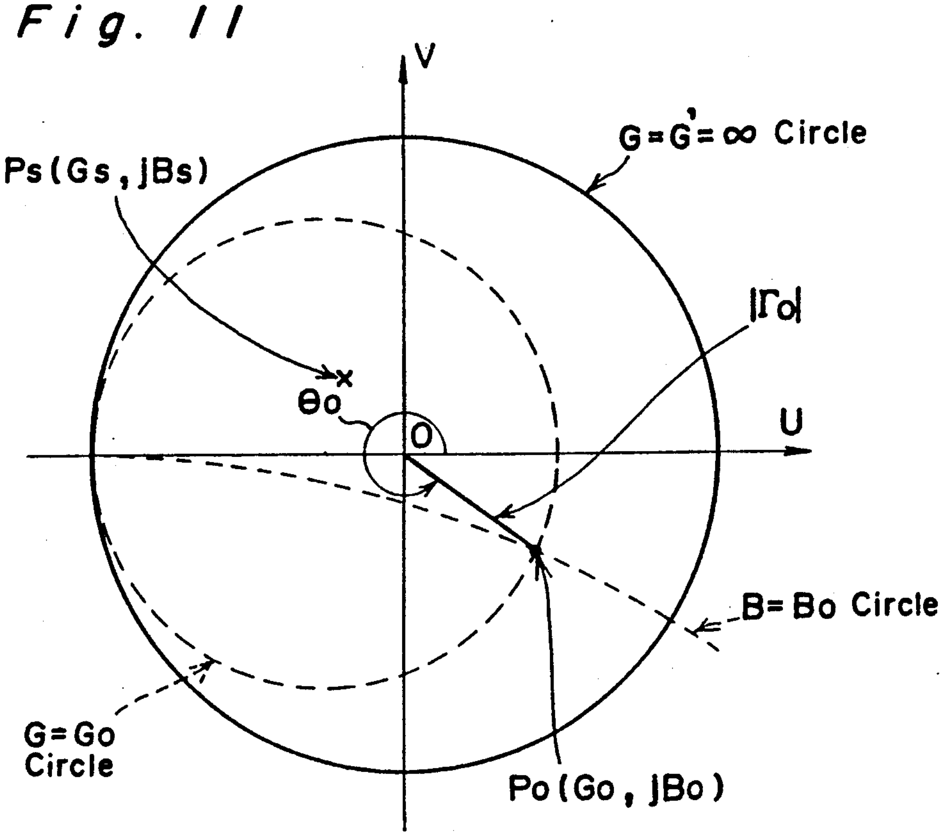

Furthermore, at step #4, there are calculated the amplitudes of the voltage standing wave |Va|, |Vb| and |Vc| from respective voltages detected by the diodes DI1, DI2 and DI3 which are respectively connected to the probes PR1, PR2 and PR3 of the voltage standing wave detector 31, and then, at step #5, there are calculated the absolute value |Γo| and the phase θo of the reflection coefficient Γo at the reference point $Ps_1$ by calculating the solutions of the simultaneous equations (4) to (7). It is to be noted that the admittance point of the admittance (referred to as a reference admittance hereinafter) Yo corresponding to the calculated reflection coefficient Γo at the reference point $Ps_1$ is located at an intersection Po of the G=Go circle and the B=Bo circle on the Smith chart, as shown in FIG. 11.

Figure 12:
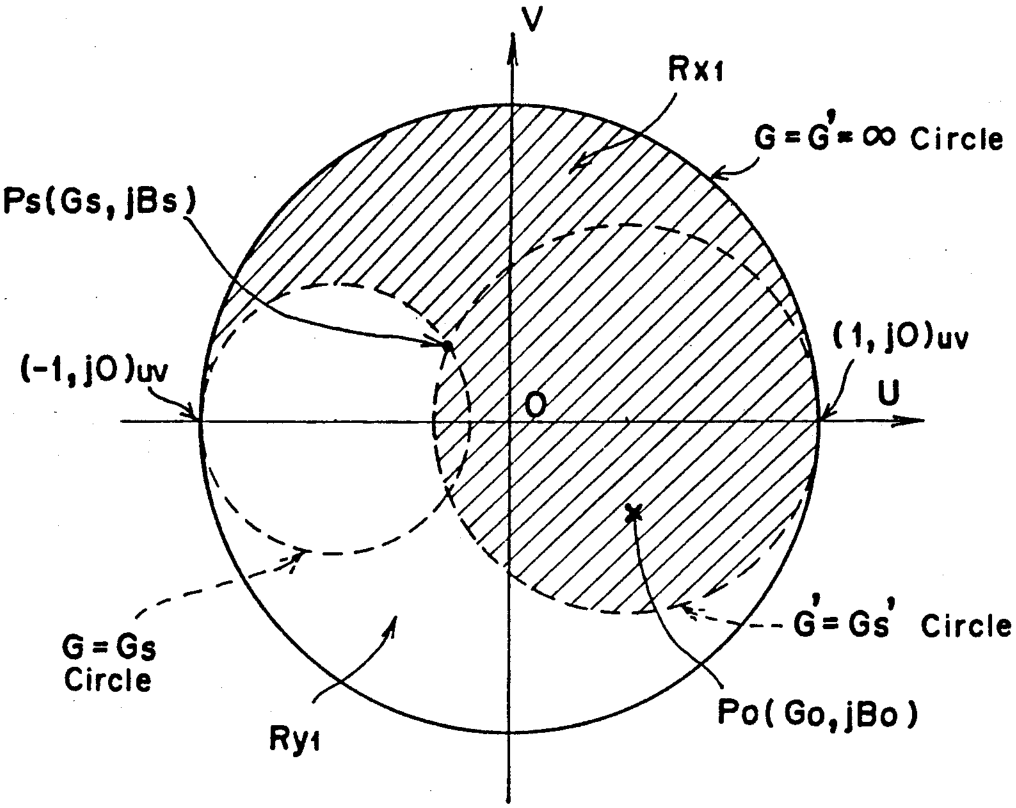
Figure 15:
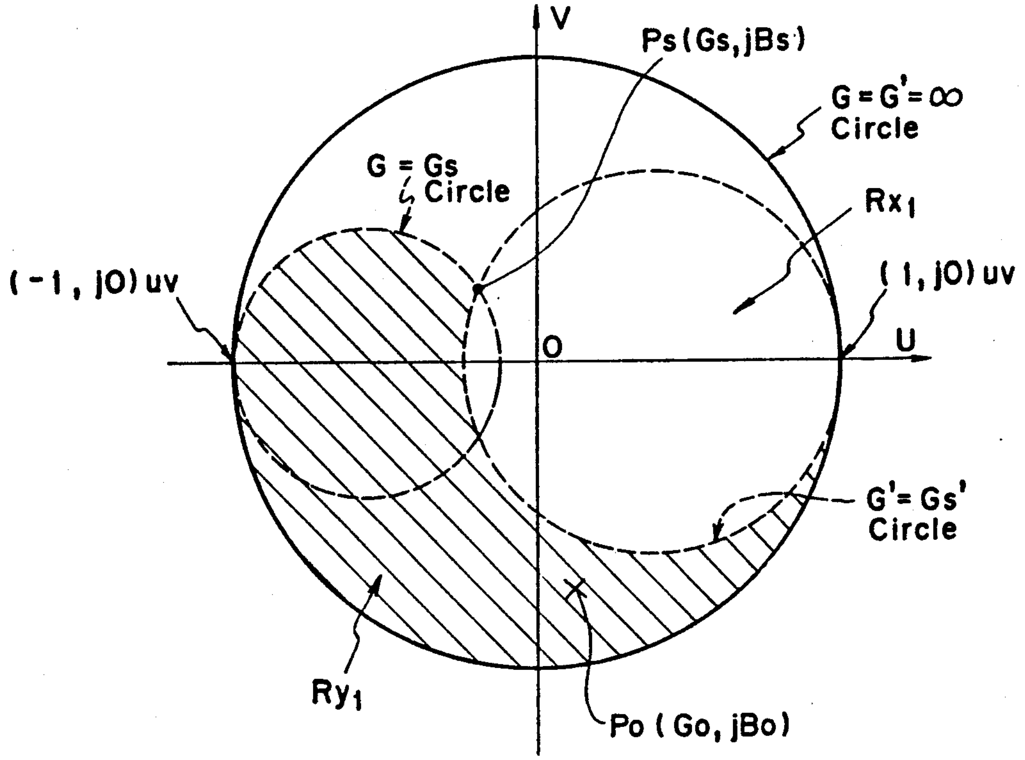

Thereafter, at step #6, it is judged whether the admittance point Po of the reference admittance Yo detected by the voltage standing wave detector 31 is located within a tuning region $Rx_1$ shown in FIG. 12, or a tuning region $Ry_1$ shown in FIG. 15. Then, if the admittance point Po is located within the tuning region $Rx_1$, the program flow goes to step #7, and then, the impedance adjusting process using the stubs S2 and S3 is executed so as to adjust the reference admittance Yo to the above desirable admittance Ys, and the program flow goes to step #9. On the other hand, if the admittance point Po is located within the tuning region $Ry_1$, the program flow goes to step #8, and then, the impedance adjusting process using the stubs S1 and S2 is executed so as to adjust the reference admittance Yo to the above desirable admittance Ys, and the program flow goes to step #9.

As shown in FIG. 12, the tuning region $Rx_1$ is a region located within the G=G'=∞, and is composed of a sum of:

(a) a region located within a G'=Gs' circle which includes the admittance point Ps of the admittance Ys on the Smith chart, and is tangent to the U=1 straight line; and (b) a region of all the positive coordinate of the V-axis of the UV coordinates given excluding a region located within a G=Gs circle which includes the admittance point Ps and is tangent to the U=−1 straight line. If the admittance point Po of the reference admittance Yo on the Smith chart is located in the tuning region $Rx_1$, the reference admittance Yo can be adjusted to the desirable admittance Ys using two stubs S2 and S3.

Furthermore, as shown in FIG. 15, the tuning region $Ry_1$ is a region located within the $G=G'=\infty$ given excluding the tuning region $Rx_1$. If the admittance point Po of the reference admittance Yo is located in the tuning region $Ry_1$ on the Smith chart the reference admittance Yo can be adjusted to the desirable admittance Ys using two stubs S1 and S1.

It is to be noted that, if the admittance point Po is located on the $G=Gs$ circle of a boundary line between the tuning regions $Rx_1$ and $Ry_1$, the above impedance adjusting process can be executed using only either stub S1 or S3. On the other hand, if the admittance point Po is located on the $G'=Gs'$ circle of a boundary line between the tuning regions $Rx_1$ and $Ry_1$, the above impedance adjusting process can be executed using only the stub S2.

Furthermore, at step #9, it is judged whether or not the operation mode is set at the repeat operation mode. If the operation mode is set at the repeat operation mode, the program flow goes to step #4, and then, the processes from steps #4 are repeated. On the other hand, if the operation mode is set at the single operation mode, the impedance adjusting mode is completed.

The repeat operation mode is useful for adjusting the impedance seen looking toward the load having a load impedance changing with a time such as the plasma generating apparatus 30. Namely, at a time t0, there is calculated reflection coefficient Γo corresponding to the reference admittance Yo in the processes of steps #4 and #5. However, if the load impedance at a time t1 defined after the time t0 is shifted from the load impedance at the time t0, the reference admittance Yo after executing the impedance adjusting process at step #7 or #8 is mismatched to the desirable admittance Ys corresponding to the desirable reflection coefficient rs which has been previously inputted at step #2. If the repeat operation mode is set in the automatic microwave impedance adjusting apparatus, the automatic microwave impedance adjusting apparatus has such an advantage that the impedance adjusting process can be executed depending on a change in the load impedance of the load such as the plasma generating apparatus 30, even though the load impedance changes.

In order to match the impedance seen looking toward the microwave oscillator 10 to the impedance seen looking toward the load of the plasma generating apparatus 30, at step #2, "zero" and "any number" are inputted as the absolute value |Γs| and the phase θs of the reflection coefficient Γs, respectively.

Furthermore, in the case of the load of the plasma generating apparatus 30, the reference impedance seen looking toward the load may not become a certain desirable impedance stably due to a frequent change in the load impedance of the plasma generating apparatus 30, even though the impedance adjusting process of the present preferred embodiment is executed so that the reference impedance seen looking toward the load at the reference point $Ps_1$ is matched to the impedance seen toward the microwave oscillator 10. In this case, at step #2, there are inputted an absolute value |Γs| and a phase θs of a desirable reflection coefficient Γs close to the impedance matching point located at the origin O of the UV coordinates so as to adjust the above reference admittance Yo to a desirable admittance Ys corresponding the above inputted reflection coefficient Γs, resulting in a stable reference impedance seen looking toward the load at the reference point $Ps_1$.

(5-2) Subroutine of Impedance adjusting process using Stubs S2 and S3

Figure 23:
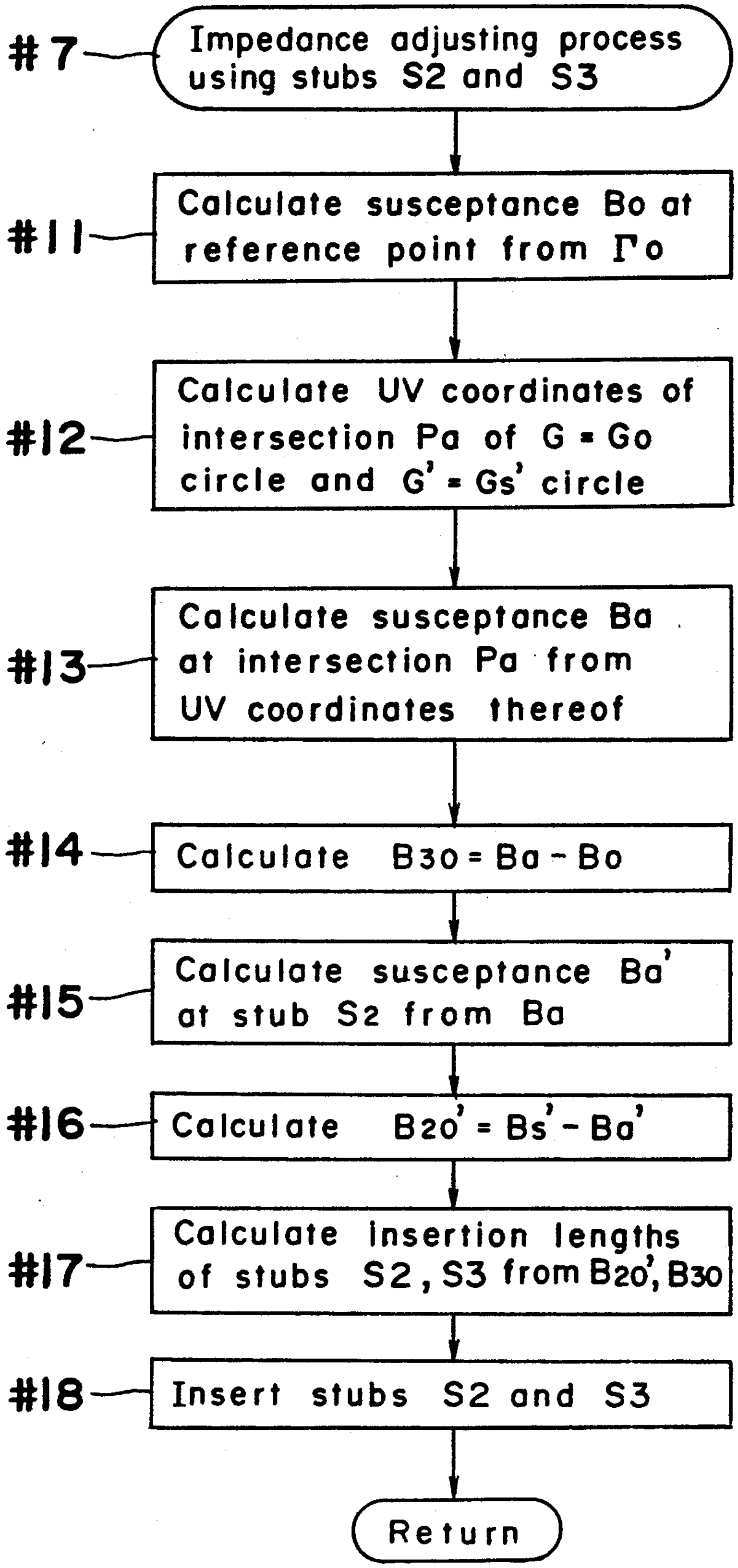
FIG. 23 is a flowchart showing a subroutine of an impedance adjusting process using stubs S2 and S3.

FIG. 23 is a flowchart showing the subroutine of the impedance adjusting process using the stubs S2 and S3 (step #7 of FIG. 22).

Figure 13:
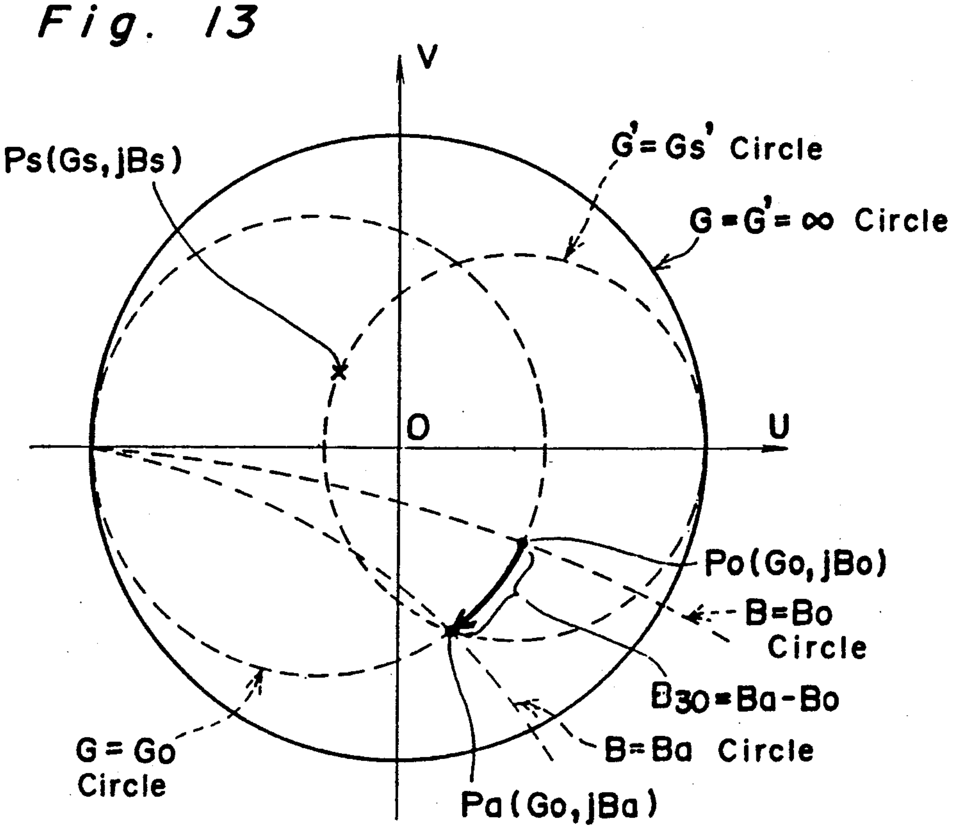

Referring to FIG. 23, first of all, at step #11, there is calculated a susceptance Bo seen looking toward the load at the reference point $Ps_1$ using the equations (8) and (11) from the absolute value |Γo| and the phase θo of the reflection coefficient Γo at the reference point $Ps_1$ which have been calculated at step #5, and then, at step #12, there are calculated the UV coordinates of an intersection Pa of the $G=Go$ circle and the $G'=Gs'$ circle shown in FIG. 13, using the equation (12) and (17).

Thereafter, at step #13, there is calculated a susceptance Ba of the intersection Pa from the UV coordinates of the intersection Pa, and then, at step #14, there is calculated a susceptance $B_{30}$ to be connected by the stub S3 to the transmission line of the rectangular waveguide 13, which is expressed by the following equation (19):

$$B_{30}=Ba-Bo \quad (19)$$

The susceptance $B_{30}$ is a difference between respective susceptances of the admittance points Po and Pa which are located on the $G=Go$ circle on the Smith chart shown in FIG. 13.

Thereafter, at step #15, there is calculated a susceptance Ba' seen looking toward the load at the point $Ps_2$ of the stub S2 using the equation (11), as described above, from the UV coordinates of the above susceptance Ba.

Thereafter, at step #16, there is calculated a susceptance $B_{20}$, to be connected by the stub S2 to the transmission line of the rectangular waveguide 13, which is expressed by the following equation (20):

$$B_{20}'=Bs'-Ba' \quad (20)$$

Figure 14:
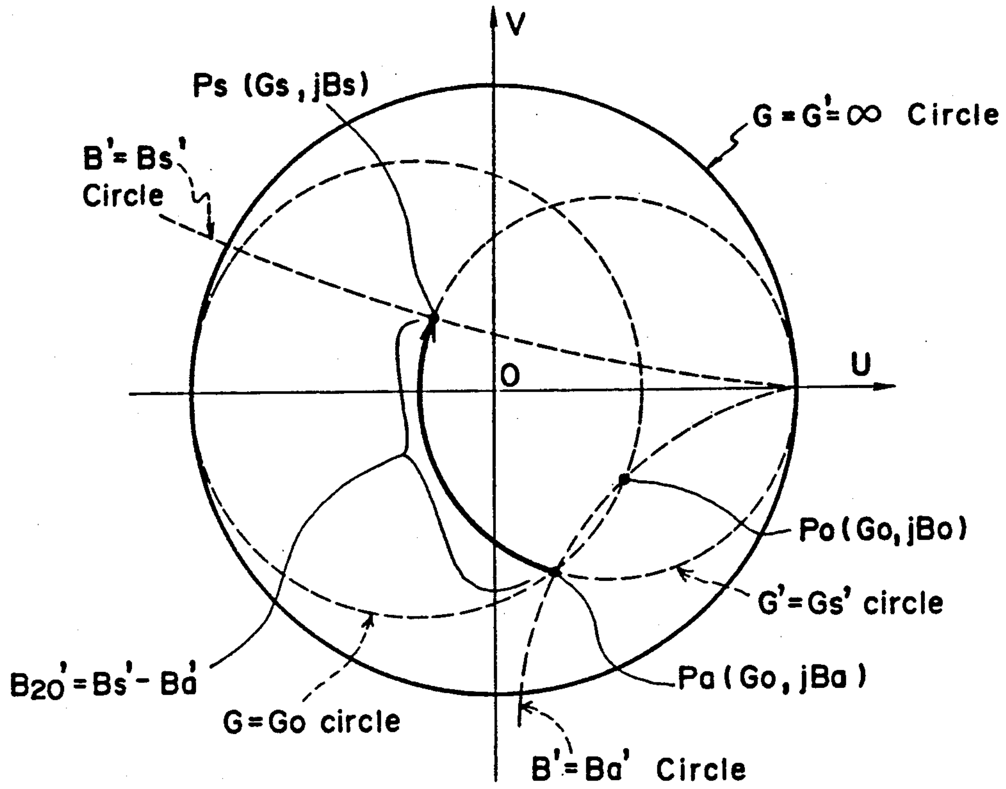

The susceptance $B_{20}'$ is a difference between respective susceptances of the admittance points Ps and Pa which are located on the $G'=Gs'$ circle on the Smith chart shown in FIG. 14.

Thereafter, at step #17, there are calculated insertion lengths of the stubs S2 and S3 using the relationship between the insertion length L thereof and the susceptance B shown in FIG. 21 which has been previously measured, from the calculated susceptances $B_{20}'$ and $B_{30}$, and then, at step #18, the stepping motors M2 and M3 are driven, respectively, so that the stubs S2 and S3 are inserted into the rectangular waveguide 13 by the calculated insertion lengths. Then, the reference admittance Yo is adjusted to the desirable admittance Ys.

(5-3) Subroutine of Impedance adjusting process using Stubs S1 and S2

Figure 24:
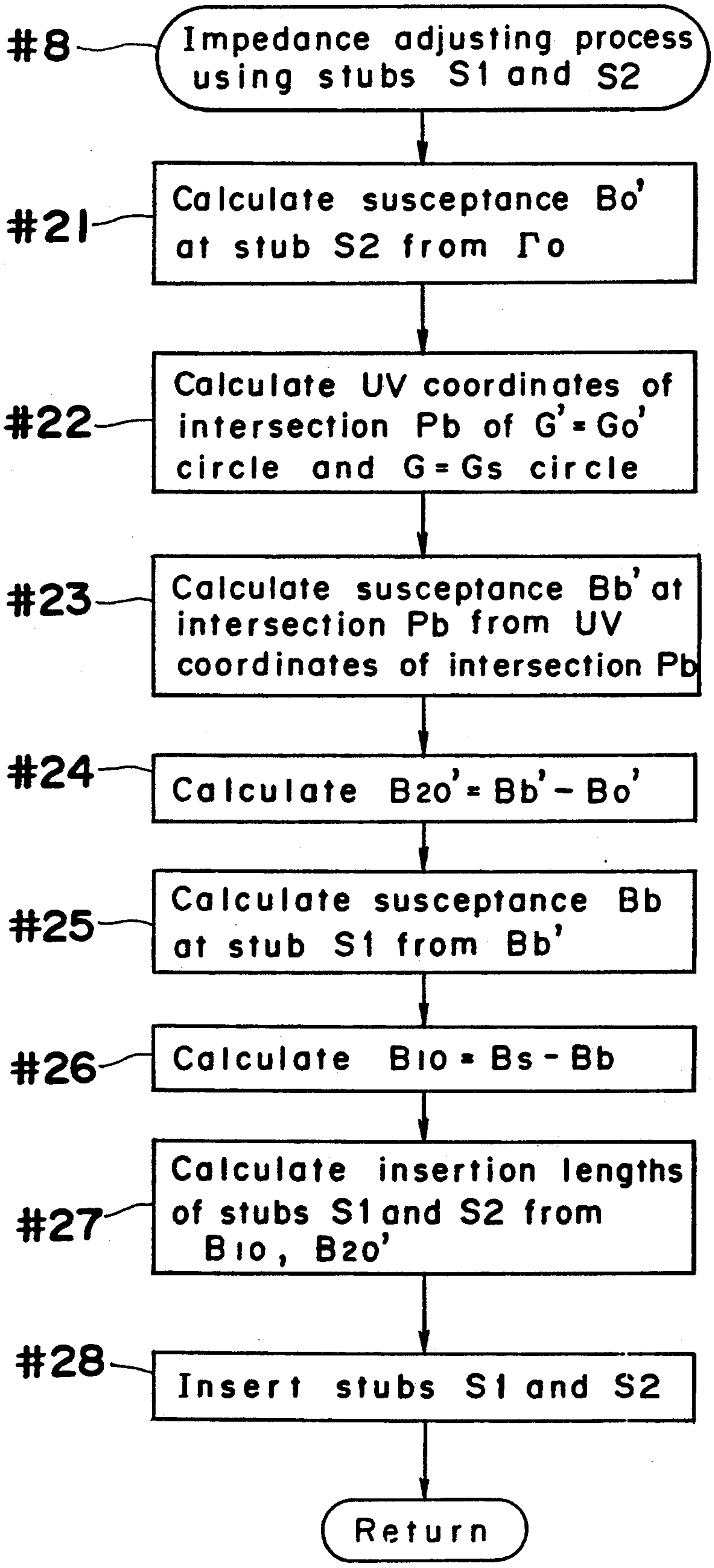
FIG. 24 is a flowchart showing a subroutine of an impedance adjusting process using stubs S1 and S1.

FIG. 24 is a flowchart showing the subroutine of the impedance adjusting process using the stubs S1 and S2 (step #8 of FIG. 22).

Figure 16:
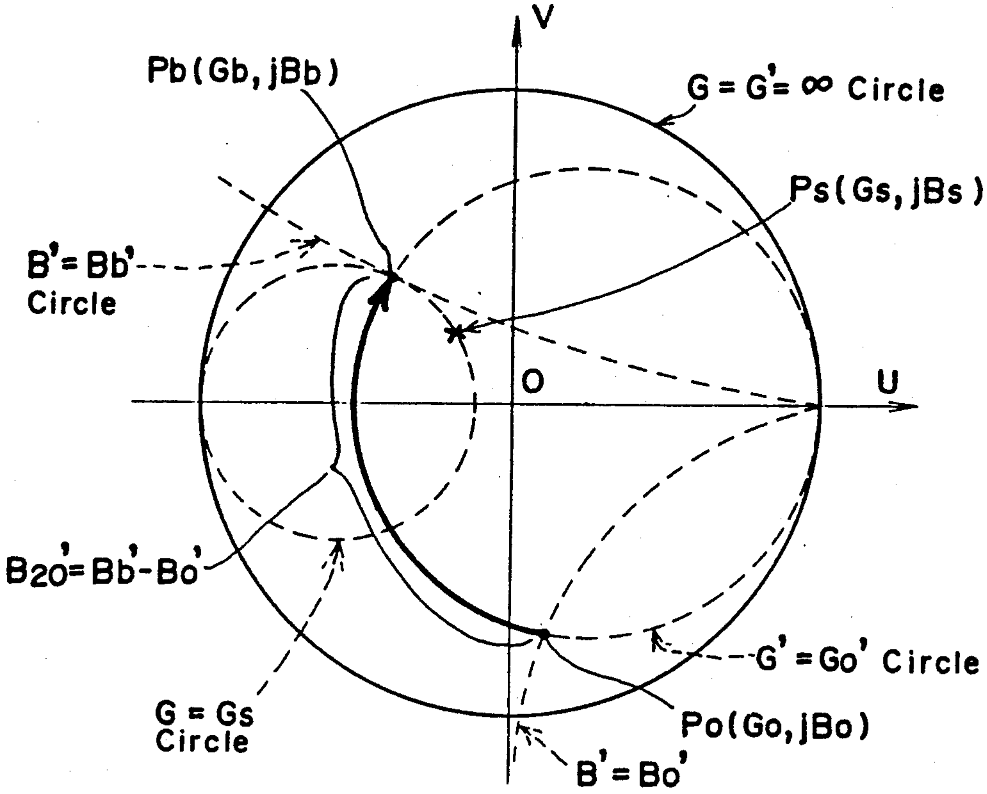

Referring to FIG. 24, first of all, at step #21, there is calculated a susceptance Bo' seen looking toward the load at the point $Ps_2$ using the equations (15) and (16) from the absolute value |Γo| and the phase θo of the reflection coefficient Γo at the reference point $Ps_1$ which have been calculated at step #5, and then, at step #22, there are calculated the UV coordinates of an intersection Pb of the G'=Go' circle and the G=Gs circle shown in FIG. 16, using the equation (12) and (17).

Thereafter, at step #23, there is calculated a susceptance Bb' of the intersection Pb from the UV coordinates of the intersection Pb, and then, at step #24, there is calculated a susceptance $B_{20}'$ to be connected by the stub S2 to the transmission line of the rectangular waveguide 13, which is expressed by the following equation (21):

$$B_{20}' = Bb' - Bo' \quad (21)$$

The susceptance $B_{20}'$ is a difference between respective susceptances of the admittance points Po and Pb which are located on the G'=Go' circle on the Smith chart shown in FIG. 16.

Thereafter, at step #25, there is calculated a susceptance Bb seen looking toward the load at the reference point $Ps_1$ using the equation (11), as described above, from the UV coordinates of the above susceptance Bb'.

Thereafter, at step #26, there is calculated a susceptance $B_{10}$ to be connected by the stub S1 to the transmission line of the rectangular waveguide 13, which is expressed by the following equation (22):

$$B_{10} = Bs - Bb \quad (22)$$

Figure 17:
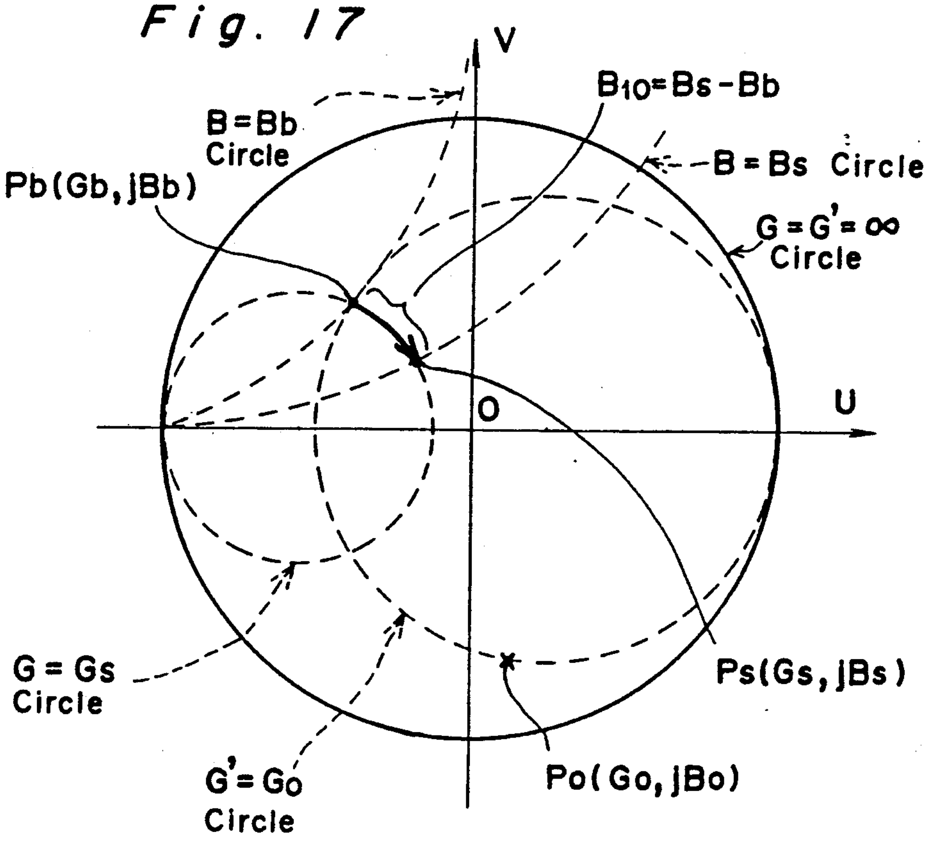

The susceptance $B_{10}$ is a difference between respective susceptances of the admittance points Ps and Pb which are located on the G=Gs circle on the Smith chart shown in FIG. 17.

Thereafter, at step #27, there are calculated insertion lengths of the stubs S1 and S2 using the relationship between the insertion length L thereof and the susceptance B shown in FIG. 21 which has been previously measured from the calculated susceptances $B_{10}$ and $B_{20}'$, and then, at step #28, the stepping motors M1 and M2 are driven, respectively, so that the stubs S1 and S2 are inserted into the rectangular waveguide 13 by the calculated insertion lengths. Then, the reference admittance Yo is adjusted to the desirable admittance Ys.

(6) Impedance matching process

Figure 18:
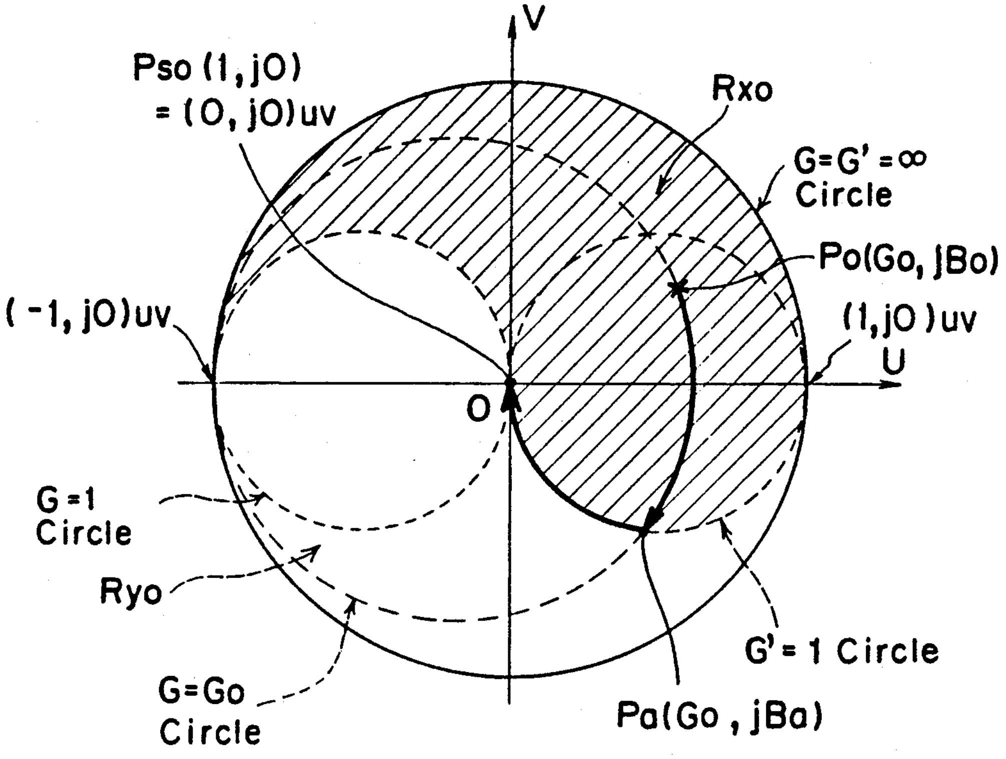
Figure 19:
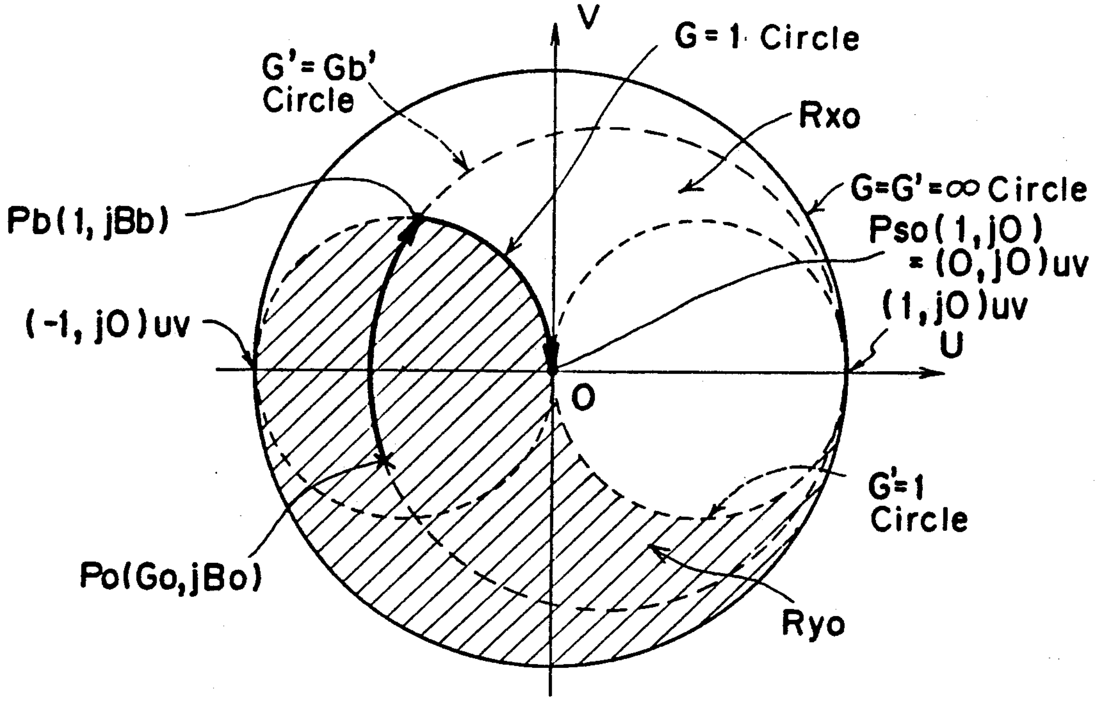

FIGS. 18 and 19 are Smith charts and complex planes of UV coordinates showing tuning regions $Rx_0$ and $Ry_0$ corresponding to the tuning regions $Rx_1$ and $Ry_1$, in the case of an impedance matching process for matching the reference admittance Yo seen looking toward the load of the plasma generating apparatus 30 at the reference point $Ps_1$ to the admittance Yso=1/Zso seen looking toward the microwave oscillator 10 thereat.

In FIGS. 18 and 19, the tuning region $Rx_0$ is a region where the impedance matching process is executed using the stubs S2 and S3 when the admittance point Po of the reference admittance Yo is located within the tuning region $Rx_0$ on the Smith chart, and the tuning region $Ry_0$ is a region where the impedance matching process is executed using the stubs S1 and S2 when the admittance point Po of the reference admittance Yo is located within the tuning region $Ry_0$ on the Smith chart.

As shown in FIGS. 18 and 19, the admittance point Ps of the desirable admittance Ys becomes the origin Pso of the UV coordinates, and a boundary line between the tuning regions $Rx_0$ and $Ry_0$ is composed of half the G=1 circle for any positive coordinate value of the V-axis of the UV coordinates, and half the G'=1 circle for any negative coordinate value of the V-axis of the UV coordinates.

The impedance matching process shown in FIG. 18 is executed in a manner similar to that of the subroutine of step #7, and the impedance matching process shown in FIG. 19 is executed in a manner similar to that of the subroutine of step #8.

(7) Modifications

At step #6 of the present preferred embodiment, it is judged whether the admittance point Po of the reference admittance Yo is located within the tuning region $Rx_1$ or $Ry_1$, and then, the impedance adjusting process using the stubs S2 and S3 is executed if the point Po is located within the tuning region $Rx_1$, on the other hand, the impedance adjusting process using the stubs S1 and S2 is executed if the point Po is located within the tuning region $Ry_1$. However, the present invention is not limited to this. If the admittance point Po is located at a partial region (referred to as a tuning region $Rz_1$ hereinafter) of the tuning region $Ry_1$ for any positive coordinate value of the V-axis of the UV coordinates, an impedance adjusting process may be executed using all the stubs S1, S2 and S3. Then, the reference admittance Yo can be adjusted to a desirable admittance Ys, for a time shorter than that of the impedance adjusting process using the stubs S1 and S2, in the above case.

FIG. 18 is a Smith chart and a complex plane of a UV coordinates showing an operation of an impedance matching process using all the stubs S1, S2 and S3.

If the admittance point Po of the reference admittance Yo is located within a tuning region $Rz_0$ on the Smith chart shown in FIG. 18, the impedance matching process is executed using all the stubs S1, S2 and S3, wherein the tuning region $Rz_0$ is a region located within half the G=1 for any positive value of the V-axis of the UV coordinates.

Figure 20:
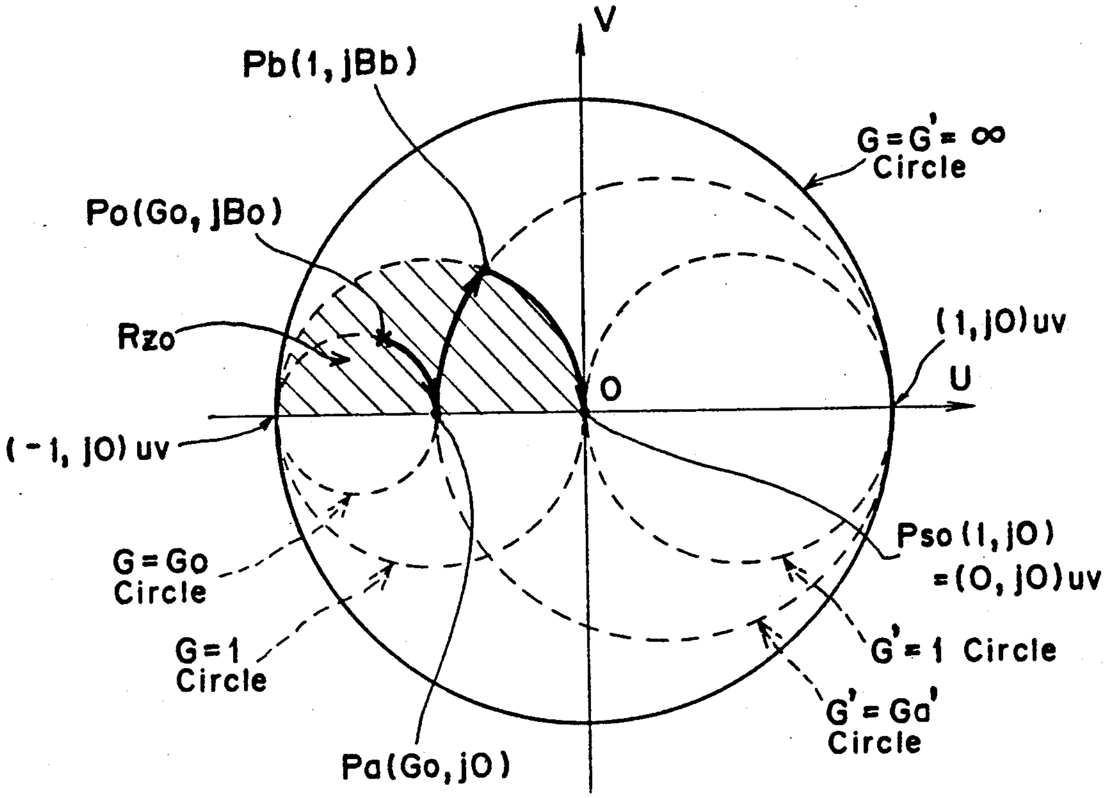

In the impedance matching process, as shown in the Smith chart of FIG. 20, the admittance point Po of the reference admittance Yo is moved using the stub S3 to an intersection Pa of the G=Go circle and the U-axis, and then, the admittance point Pa is moved using the stub S2 to an intersection Pb of the G=1 circle and a G'=Ga', wherein the G'=Ga' circle includes the admittance point Pa and is tangent to the U=1 straight line. Thereafter, the admittance point Pb is moved using the stub S1 to the impedance matching point Pso. Thus, the susceptances of respective stubs S1, S2 and S3 are changed so as to match the reference admittance Yo to the admittance Yso seen looking toward the microwave oscillator 10 at the reference point $Ps_1$. The calculation of this impedance matching process is executed in a manner similar to that of the subroutine of step #7 or #8.

In the present preferred embodiment, the apparatus for executing the impedance adjusting process including the impedance matching process in the transmission line of the rectangular waveguide is described. However, the present invention is not limited to this. The present invention can be applied to an automatic microwave impedance adjusting apparatus for adjusting an impedance seen looking toward a microwave load in the other kinds of microwave transmission lines such as a microstrip line, a slot line, a coplanar line.

In the present preferred embodiment, there are calculated the absolute value $|\Gamma o|$ and the phase $\theta o$ of the reflection coefficient Γo at the reference point by the CPU 60 from the amplitudes of the voltage standing wave detected by respective probes PR1, PR2 and PR3 by the standing wave measuring method using the probes PR1, PR2 and PR3 and the diodes DI1, DI2 and DI3. However, the present invention is not limited to this. For example, after measuring the impedance seen looking to a load at a point of a microwave transmission line by another measuring method for measuring the impedance thereof, a reflection coefficient corresponding to the measured impedance may be calculated, and then, the impedance adjusting process of the present invention may be executed.

In the voltage standing wave detector 31 of the present preferred embodiment, three probes PR1, PR2 and PR3 are mounted at equal spaces of λg/6 in the longitudinal direction of the rectangular waveguide 13. However, the present invention is not limited to this. At least three probes may be mounted at different points at predetermined spaces, one of which is not a product of any natural number and the length λg/2. Each space between the probes is preferably set at a length equal to a product of any natural number and the length λg/6 except for products of any natural number and the length λg/2. For example, when each space between the probes is set at the length λg/3, the squares of the amplitudes of the voltage standing wave detected by respective probes PR1, PR2 and PR3 are expressed as follows:

$$|Va|^2=|E|^2+|D|^2-2|E|\cdot|D|\cdot cos(\pi-\theta o) \quad (23)$$

$$|Va|^2 = |E|^2 + |D|^2 - 2|E|\cdot|D|\cdot\cos(\pi-\theta o) \quad (23)$$

$$|Vb|^2 = |E|^2 + |D|^2 - 2|E|\cdot|D|\cdot\cos\left(\pi-\theta o+\frac{8}{3}\pi\right) \quad (24)$$

$$|Vc|^2 = |E|^2 + |D|^2 - 2|E|\cdot|D|\cdot\cos\left(\pi-\theta o+\frac{4}{3}\pi\right) \quad (25)$$

In the present preferred embodiment, the space in the longitudinal direction of the rectangular waveguide 13 between the stub S1 and the probe PR1 is set at the length λg/2 for convenience of the explanation. However, the present invention is not limited to this. This space may be set at any distance.

In the present preferred embodiment, there are provided three stubs S1, S2 and S3 as susceptance elements to be connected to the transmission line of the rectangular waveguide 13. However, the present invention is not limited to this. The other kinds of microwave variable susceptance element may be used. A susceptance to be connected thereto may be changed using at least two stubs depending on a desirable impedance or a desirable admittance seen looking toward a load at a reference point of a microwave transmission line.

Furthermore, in the present preferred embodiment, three stubs S1, S2 and S3 are mounted at equal spaces of λg/4 in the longitudinal direction of the rectangular waveguide 13. However, the present invention is not limited to this. These stubs S1, S2 and S3 may be mounted at different points at predetermined spaces in the longitudinal direction of the rectangular waveguide 13 so that the spaces other than one space therebetween are not a product of any natural number and the length λg/2.

At step #2 of FIG. 22 of the present preferred embodiment, there are inputted the absolute value |Γs| and the phase θo of the reflection coefficient Γs corresponding to the desirable impedance Zs seen looking toward the load at the reference point $Ps_1$. However, the present invention is not limited to this. A resistance Rs and a reactance Xs of a desirable impedance Zs may be inputted, or a conductance Gs and a susceptance Bs of a desirable admittance Ys corresponding to a desirable impedance Zs may be inputted.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. An automatic microwave impedance adjusting apparatus comprising:

a microwave transmission line connected between a microwave oscillator and a microwave load, said microwave transmission line is a rectangular waveguide;

measuring means for measuring either an impedance seen looking toward said microwave load at a mounted point thereof or a reflection coefficient thereat by detecting a voltage standing wave of a microwave propagating on said microwave transmission line, said measuring means comprising at least three probes mounted at different points at predetermined spaces in the longitudinal direction of said rectangular waveguide so that each of said spaces therebetween is not set at a product of any natural number and half a waveguide length of a microwave propagating on said microwave transmission line;

variable impedance means for changing an impedance to be connected to a mounted point thereof, said variable impedance means being mounted on said microwave load side of said measuring means on said microwave transmission line; and control means for controlling said variable impedance means responsive to a value measured by said measuring means so as to adjust said impedance seen looking toward said microwave load to a predetermined value, said control means comprising calculating means for calculating said impedance of said variable impedance means to be connected to said mounted point thereof required for adjusting said impedance seen looking toward said microwave load to a predetermined value, responsive to said value measured by said measuring means, and for outputting data representing said calculated impedance to said variable impedance means.

2. The apparatus as claimed in claim wherein said variable impedance means comprises at least two stubs mounted at different points at predetermined spaces in the longitudinal direction of said rectangular waveguide so that said spaces other than one space therebetween are not set at a product of any natural number and half a waveguide length of a microwave propagating on said microwave transmission line.

3. The apparatus as claimed in claim 2, wherein said variable impedance means comprises three stubs mounted at different points at equal spaces of a quarter of said waveguide length in the longitudinal direction of said rectangular waveguide.

4. The apparatus as claimed in any one of claim 2 or 3, wherein said control means further comprises:

calculating means for calculating respective insertion lengths of said stubs to be inserted into said rectangular waveguide required for adjusting said impedance seen looking toward said microwave load to a predetermined value, responsive to said value measured by said measuring means, and for outputting data representing said calculated insertion lengths to said variable impedance means.

5. An automatic microwave impedance adjusting method including:

a first step of measuring either an impedance seen looking toward a microwave load at a predetermined reference point of a microwave transmission line connected between a microwave oscillator and said microwave load or a reflection coefficient thereat by detecting a voltage standing wave of a microwave propagating on said microwave transmission line, wherein said microwave transmission line is a rectangular waveguide;

a second step of controlling a variable impedance means mounted on said microwave load side of said reference point on said microwave transmission line responsive to said value measured at said first step, so as to adjust said impedance seen looking toward said microwave load to a predetermined value, calculating an impedance of said variable impedance means to be connected to said mounted point thereof required for adjusting said impedance seen looking toward said microwave load at said reference point to a predetermined value, responsive to said value measured at said first step, and outputting data representing said calculated impedance to said variable impedance means;

said variable impedance means comprises first to third stubs mounted at different points in an order of said first to third stubs at equal spaces of a quarter of said waveguide length in the longitudinal direction of said rectangular waveguide;

a whole region within a Smith chart representing an impedance seen looking toward said microwave load is divided into a first region for executing said impedance adjusting process of said second step using said first and second stubs when an impedance point seen looking toward said microwave load at said reference point is located within said first region, and a second region for executing said impedance adjusting process of said second step using said second and third stubs when said impedance point is located within said second region; and said second step includes:

a third step of calculating an impedance seen looking toward said microwave load at said reference point responsive to said value measured at said first step;

a fourth step of judging whether an impedance point of said impedance calculated at said third step is located within either said first region or said second region on said Smith chart; and a fifth step of executing said impedance adjusting process of said second step using said first and second stubs when it is judged at said fourth step that said impedance point of said impedance calculated at said third step is located within said first region, and executing said impedance adjusting process of said second step using said second and third stubs when it is judged at said fourth step that said impedance point of said impedance calculated at said third step is located within said second region.

6. The method as claimed in claim 5, wherein said processes of said first and second steps are repeated.

7. An automatic microwave impedance adjusting method including:

a first step of measuring either an impedance seen looking toward a microwave load at a predetermined reference point of a microwave load at a predetermined reference point of a microwave transmission line connected between a microwave oscillator and said microwave load or a reflection coefficient thereat by detecting a voltage standing wave of a microwave propagating on said microwave transmission line, wherein said microwave transmission line is a rectangular waveguide;

a second step of controlling a variable impedance means mounted on said microwave load side of said reference point on said microwave transmission line responsive to said value measured at said first step, so as to adjust said impedance seen looking toward said microwave load to a predetermined value, calculating an impedance of said variable impedance means to be connected to said mounted point thereof required for adjusting said impedance seen looking toward said microwave load at said reference point to a predetermined value, responsive to said value measured at said first step, and outputting data representing said calculated impedance to said variable impedance means;

said variable impedance means comprises first to third stubs mounted at different point in an order of said first to third stubs at equal spaces of a quarter of said waveguide length in the longitudinal direction of said rectangular waveguide;

a whole region within a Smith chart representing an impedance seen looking toward said microwave load is divided into a first region for executing said impedance adjusting process of said second step using first and second stubs when an impedance point seen looking toward said microwave load at said reference point is located within said first region, a second region for executing said impedance adjusting process of said second step using said second and third stubs when said impedance point is located within said second region, and a third region for executing said impedance adjusting process of said second step using all said first to third stubs when said impedance point is located within said third region; and said second step includes:

a third step of calculating an impedance seen looking toward said microwave load at said reference point responsive to said value measured at said first step;

a fourth step of judging whether an impedance point of said impedance calculated at said third step is located within either said first region, said second region or said third region on said smith chart; and a fifth step of executing said impedance adjusting process of said second step using said first and second stubs when it is judged at said fourth step that said impedance point of said impedance calculated at said third step is located within said first region, executing said impedance adjusting process of said second step using said second and third stubs when it is judged at said fourth step that said impedance point of said impedance calculated at said third step is located within said second region, and executing said impedance adjusting process of said second step using all said first to third stubs when it is judged at said fourth step that said impedance point of said impedance calculated at said third step is located within said third region.

8. The method as claimed in claim 7, wherein said processes of said first and second steps are repeated.

* * * * *

UNITED STATES PATENT AND TRADEMARK OFFICE
CERTIFICATE OF CORRECTION

PATENT NO. : 5,079,507

DATED : January 7, 1992

INVENTOR(S) : Yuji Ishida, et al.

It is certified that error appears in the above-identified patent and that said Letters Patent is hereby corrected as shown below:

Column 1, Line 17, after "method" insert --therefor.--.

Column 9, Line 45, in the first instance "Va, Vb and Vc" should read as --$\vec{Va}$, $\vec{Vb}$ and $\vec{Vc}$--.

Column 9, Line 46, in the first instance "D" should read as --$\vec{D}$--.

Column 9, Line 47, in the first instance "E" should read as --$\vec{E}$--.

Column 10, Line 16, delete "$|Va|^2=|E|^2+|D|^2-2|E|\cdot|D|\cdot\cos(\pi-\theta o)$ (4)".

Column 10, Line 28, delete "$|Vc|^2=|E|^2+|D|^2\cdot 2|E|\cdot|D|\cdot\cos(\pi-\theta o+\frac{2}{3}\pi)$ (5)".

Column 10, Line 39, "Γo" should read as --θo--.

CERTIFICATE OF CORRECTION

PATENT NO. : 5,079,507

DATED : January 7, 1992

INVENTOR(S) : Yuji Ishida, et al.

It is certified that error appears in the above-identified patent and that said Letters Patent is hereby corrected as shown below:

Column 11, Line 1, "Y1" should read as --$Y\ell$--.

Column 12, Line 23, "thereof s" should read as --thereof is--.

Column 13, Line 10, Equation 17, "$u_o$ =" should read as -- $u_o$ - --.

Column 13, Line 17, "G'32 Go'" should read as --G' = Go'--.

Column 16, Line 38, "$B_{2o,}$" should read as --$B_{2o}'$--.

Column 19, Line 31, delete "$|Va|^2=|E|^2+|D|^2-2|E|\cdot|D|\cdot\cos(\pi-\theta o)$ (23)".

Column 20, Line 63, after "claim" insert --1--.

UNITED STATES PATENT AND TRADEMARK OFFICE
CERTIFICATE OF CORRECTION

PATENT NO. : 5,079,507

DATED : January 7, 1992

INVENTOR(S) : Yuji Ishida, et al.

It is certified that error appears in the above-identified patent and that said Letters Patent is hereby corrected as shown below:

Column 21, Line 10, "claim" should read as --claims--.

Signed and Sealed this

Tenth Day of August, 1993

Attest:

Michael K. Kirk

MICHAEL K. KIRK

*Attesting Officer*

*Acting Commissioner of Patents and Trademarks*

UNITED STATES PATENT AND TRADEMARK OFFICE

CERTIFICATE OF CORRECTION

PATENT NO. : 5,079,507

DATED : January 7, 1992

INVENTOR(S) : Yuji Ishida, et al.

It is certified that error appears in the above-indentified patent and that said Letters Patent is hereby corrected as shown below:

On the Title Page, Section [56]: after "3,470,462" and before "3,975,679" insert the following:

-- 3,617,953 11/1971 Kingma, et al...............--

On the Title Page, Column 2, line 4: insert the following: -- FOREIGN PATENT DOCUMENTS 61-1101 1/1986 Japan--

Signed and Sealed this

Tenth Day of May, 1994

Attest:

Bruce Lehman

BRUCE LEHMAN

*Attesting Officer* *Commissioner of Patents and Trademarks*